United States Patent
Jiang et al.

(10) Patent No.: US 11,749,495 B2
(45) Date of Patent: Sep. 5, 2023

(54) BANDPASS CHARGED PARTICLE ENERGY FILTERING DETECTOR FOR CHARGED PARTICLE TOOLS

(71) Applicant: KLA Corporation, Milpitas, CA (US)

(72) Inventors: Youfei Jiang, Milpitas, CA (US); Michael Steigerwald, Milpitas, CA (US)

(73) Assignee: KLA Corp., Milpitas, CA (US)

( * ) Notice: Subject to any disclaimer, the term of this patent is extended or adjusted under 35 U.S.C. 154(b) by 99 days.

(21) Appl. No.: 17/494,784

(22) Filed: Oct. 5, 2021

(65) Prior Publication Data

US 2023/0104558 A1 Apr. 6, 2023

(51) Int. Cl.
| | |
|---|---|
| H01J 37/244 | (2006.01) |
| H01J 37/28 | (2006.01) |
| H01J 37/05 | (2006.01) |
| H01J 37/147 | (2006.01) |

(52) U.S. Cl.
CPC ............ *H01J 37/244* (2013.01); *H01J 37/05* (2013.01); *H01J 37/1471* (2013.01); *H01J 37/28* (2013.01); *H01J 2237/0492* (2013.01); *H01J 2237/2448* (2013.01); *H01J 2237/24475* (2013.01)

(58) Field of Classification Search
CPC .......... H01J 37/00; H01J 37/02; H01J 37/244; H01J 37/05; H01J 37/1471; H01J 37/26; H01J 37/28; H01J 37/22; H01J 2237/0492; H01J 2237/24475; H01J 2237/2448
USPC ......................................... 250/306, 307, 311
See application file for complete search history.

(56) References Cited

U.S. PATENT DOCUMENTS

| | | | | |
|---|---|---|---|---|
| 4,246,479 | A | * | 1/1981 | Gopinathan ............ H01J 37/05 250/397 |
| 5,644,132 | A | * | 7/1997 | Litman .................. H01J 37/244 250/397 |
| 7,141,791 | B2 | | 11/2006 | Masnaghetti et al. |
| 7,276,694 | B1 | | 10/2007 | Bertsche |
| 7,714,287 | B1 | | 5/2010 | James et al. |
| 8,237,213 | B2 | | 8/2012 | Liu |
| 8,334,508 | B1 | | 12/2012 | Mankos |
| 8,664,594 | B1 | | 4/2014 | Jiang et al. |

(Continued)

OTHER PUBLICATIONS

International Search Report for PCT/US2022/045736 dated Jan. 30, 2023.

*Primary Examiner* — Jason L McCormack
(74) *Attorney, Agent, or Firm* — Ann Marie Mewherter

(57) ABSTRACT

Methods and systems for detecting charged particles from a specimen are provided. One system includes a first repelling mesh configured to repel charged particles from a specimen having an energy lower than a first predetermined energy and a second repelling mesh configured to repel the charged particles that pass through the first repelling mesh and have an energy that is lower than a second predetermined energy. The system also includes a first attracting mesh configured to attract the charged particles that pass through the first repelling mesh, are repelled by the second repelling mesh, and have an energy that is higher than the first predetermined energy and lower than the second predetermined energy. The system further includes a first detector configured to generate output responsive to the charged particles that pass through the first attracting mesh.

35 Claims, 15 Drawing Sheets

(56) References Cited

U.S. PATENT DOCUMENTS

| | | | |
|---|---|---|---|
| 8,692,204 B2 | 4/2014 | Kojima et al. | |
| 8,698,093 B1 | 4/2014 | Gubbens et al. | |
| 8,716,662 B1 | 5/2014 | MacDonald et al. | |
| 8,946,649 B2 | 2/2015 | Sasaki et al. | |
| 9,000,395 B2 | 4/2015 | Ren et al. | |
| 10,614,992 B2 | 4/2020 | Matsui et al. | |
| 10,643,819 B2 | 5/2020 | Masnaghetti et al. | |
| 2002/0134936 A1* | 9/2002 | Matsui | H01J 37/28 250/310 |
| 2008/0111069 A1* | 5/2008 | Notte | G01N 23/2255 250/282 |
| 2009/0242759 A1* | 10/2009 | Bray | H01J 37/3053 250/307 |
| 2010/0294931 A1* | 11/2010 | Zarchin | H01J 37/244 250/306 |
| 2011/0260057 A1* | 10/2011 | Otaka | H01J 37/28 250/307 |
| 2014/0299767 A1* | 10/2014 | Bizen | H01J 37/244 250/307 |
| 2014/0361167 A1* | 12/2014 | Morishita | H01J 37/28 250/310 |
| 2016/0035533 A1* | 2/2016 | Ren | H01J 37/28 250/305 |
| 2016/0372304 A1 | 12/2016 | Masnaghetti et al. | |
| 2017/0301512 A1* | 10/2017 | Sekiguchi | H01J 37/28 |
| 2019/0244783 A1* | 8/2019 | Ohashi | H01L 22/12 |
| 2020/0006033 A1 | 1/2020 | Hung et al. | |
| 2020/0211819 A1* | 7/2020 | Dillen | H01J 37/28 |
| 2021/0055098 A1* | 2/2021 | Yamaki | H01J 37/28 |
| 2022/0223372 A1* | 7/2022 | Akimoto | H01J 37/265 |

\* cited by examiner

BANDPASS CHARGED PARTICLE ENERGY FILTERING DETECTOR FOR CHARGED PARTICLE TOOLS

BACKGROUND OF THE INVENTION

1. Field of the Invention

This invention generally relates to methods and systems for detecting charged particles from a specimen. Certain embodiments relate to a bandpass charged particle energy filtering detector for charged particle tools.

2. Description of the Related Art

The following description and examples are not admitted to be prior art by virtue of their inclusion in this section.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers and other substrates to promote higher yield in the manufacturing process and thus higher profits. Inspection has always been an important part of fabricating semiconductor devices such as ICs. However, as the dimensions of semiconductor devices decrease, inspection becomes even more important to the successful manufacture of acceptable semiconductor devices because smaller defects can cause the devices to fail.

Defect review typically involves re-detecting defects detected as such by an inspection process and generating additional information about the defects at a higher resolution using either a high magnification optical system or a scanning electron microscope (SEM). Defect review is therefore performed at discrete locations on the specimen where defects have been detected by inspection. The higher resolution data for the defects generated by defect review is more suitable for determining attributes of the defects such as profile, roughness, more accurate size information, etc.

Metrology processes are also used at various steps during a semiconductor manufacturing process to monitor and control the process. Metrology processes are different than inspection processes in that, unlike inspection processes in which defects are detected on a specimen, metrology processes are used to measure one or more characteristics of the specimen that cannot be determined using currently used inspection tools. For example, metrology processes are used to measure one or more characteristics of a specimen such as a dimension (e.g., line width, thickness, etc.) of features formed on the specimen during a process such that the performance of the process can be determined from the one or more characteristics. In addition, if the one or more characteristics of the specimen are unacceptable (e.g., out of a predetermined range for the characteristic(s)), the measurements of the one or more characteristics of the specimen may be used to alter one or more parameters of the process such that additional specimens manufactured by the process have acceptable characteristic(s).

Metrology processes are also different than defect review processes in that, unlike defect review processes in which defects that are detected by inspection are re-visited in defect review, metrology processes may be performed at locations at which no defect has been detected. In other words, unlike defect review, the locations at which a metrology process is performed on a specimen may be independent of the results of an inspection process performed on the specimen. In particular, the locations at which a metrology process is performed may be selected independently of inspection results. In addition, since locations on the specimen at which metrology is performed may be selected independently of inspection results, unlike defect review in which the locations on the specimen at which defect review is to be performed cannot be determined until the inspection results for the specimen are generated and available for use, the locations at which the metrology process is performed may be determined before an inspection process has been performed on the specimen.

In quality control processes such as inspection, defect review, and metrology that use charged particles, e.g., electrons or ions, it can often be important to only detect the charged particles from the specimen that have certain energies. In particular, different types of charged particles returned from a specimen can be more or less sensitive to certain defects or measurements. The different types of charged particles can often be separated from each other because they have different energies. Several different methods have been created for separating charged particles having different energies such as threshold energy filters, energy dispersive sectors with segmented detectors, and multiple electrostatic depressors.

While each of the charged particle separation methods mentioned above have found some success in the art, there are one or more disadvantages to each of the currently used methods. For example, a threshold energy filter can only separate electrons with energies larger or smaller than the thresholding energy as applied to the energy filter mesh. In another example, it is substantially difficult to clearly separate electrons with different energies using an energy dispersive sector with a segmented detector due to the mix of emitting energies and angles. In an additional example, for multiple electrostatic depressors, it is substantially challenging to design those multiple detectors floating at relatively high voltages. In addition, if the detectors are applied to the voltages near or at the same voltages of these electrostatic depressors, the electrons hitting on detectors have relatively small impacting energies, which is difficult to generate signals, or may have substantially low signal-to-noise ratios.

Accordingly, it would be advantageous to develop systems and/or methods for detecting charged particles from a specimen that do not have one or more of the disadvantages described above.

SUMMARY OF THE INVENTION

The following description of various embodiments is not to be construed in any way as limiting the subject matter of the appended claims.

One embodiment relates to a system configured to detect charged particles from a specimen. The system includes a first repelling mesh positioned in a path of charged particles from a specimen and configured to repel the charged particles having an energy that is lower than a first predetermined energy. The system also includes a second repelling mesh configured to repel the charged particles that pass through the first repelling mesh and have an energy that is lower than a second predetermined energy. In addition, the system includes a first attracting mesh configured to attract the charged particles that pass through the first repelling mesh, are repelled by the second repelling mesh, and have an energy that is higher than the first predetermined energy and lower than the second predetermined energy. The system further includes a first detector configured to generate output responsive to the charged particles that pass through the first attracting mesh. The system may be further configured as described herein.

Another embodiment relates to a computer-implemented method for detecting charged particles from a specimen. The method includes repelling charged particles from a specimen having an energy that is lower than a first predetermined energy with a first repelling mesh positioned in a path of the charged particles from the specimen. The method also includes repelling the charged particles that pass through the first repelling mesh and have an energy that is lower than a second predetermined energy with a second repelling mesh. In addition, the method includes attracting the charged particles that pass through the first repelling mesh, are repelled by the second repelling mesh, and have an energy that is higher than the first predetermined energy and lower than the second predetermined energy with a first attracting mesh. The method further includes generating output responsive to the charged particles that pass through the first attracting mesh with a first detector.

Each of the steps of the method may be performed as described further herein. In addition, the method may include any other step(s) of any other method(s) described herein. The method may be performed by any of the systems described herein.

An additional embodiment relates to a non-transitory computer-readable medium storing program instructions executable on a computer system for performing a computer-implemented method for detecting charged particles from a specimen. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Other objects and advantages of the invention will become apparent upon reading the following detailed description and upon reference to the accompanying drawings in which.

Figure 1:
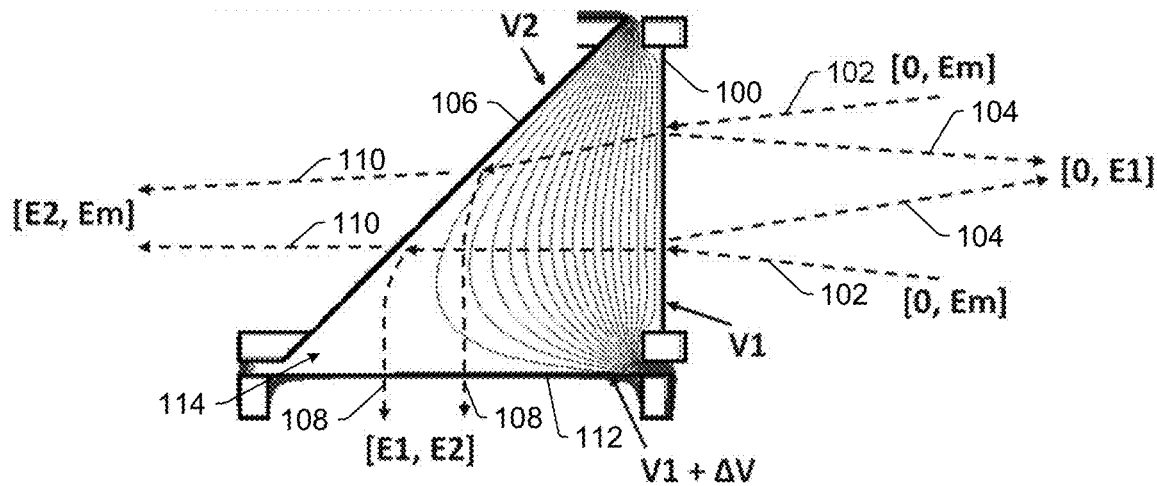
FIG. 1 is a schematic diagram illustrating a cross-sectional view of an embodiment of a triangular energy band cavity.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

The embodiments described herein generally relate to bandpass charged particle (e.g., electron) energy filtering detectors for charged particle tools (e.g., electron microscopes). As described further herein, the embodiments advantageously have the capability to select any specific energy band for returned charged particle signals, which can then be used for generating specimen images (e.g., scanning electron microscope (SEM) images) with enhanced contrast of any specific defects.

One embodiment relates to a system configured to detect charged particles from a specimen. In one embodiment, the charged particles are electrons. In another embodiment, the charged particles are helium ions. Although some embodiments may be described herein with respect to electrons, all of the embodiments may be configured for use with charged particles such as electrons, helium ions, or any other suitable charged particles known in the art of semiconductor manufacturing. The charged particles from the specimen may be caused by illumination of the specimen with charged particles (as in an electron or ion beam imaging tool) or may be caused by some other non-charged particle means (e.g., x-rays). The charged particles may also include any of the charged particles described herein and may be "from the specimen" in any manner such as reflected, scattered, transmitted, etc. from or by the specimen.

In some embodiments, the specimen is a wafer. The wafer may include any wafer known in the semiconductor arts. Although some embodiments may be described herein with respect to a wafer or wafers, the embodiments are not limited in the specimens for which they can be used. For example, the embodiments described herein may be used for specimens such as reticles, flat panels, printed circuit (PC) boards, and other semiconductor specimens.

The system includes a first repelling mesh positioned in a path of charged particles from a specimen and configured to repel the charged particles having an energy that is lower than a first predetermined energy. Although some elements are described herein as "meshes," it is to be understood that each of such "meshes" may be replaced with a grid or another suitable element that can function as described herein. As shown in FIG. 1, the system may include first repelling mesh 100 positioned in a path of charged particles 102 from a specimen (not shown in FIG. 1). The first repelling mesh repels charged particles 104 having an energy lower than the first predetermined energy by having a first voltage, V1, applied thereto. In other words, signal electrons from a specimen having a variety of energies in an energy band of [0, Em] may encounter first repelling mesh 100, electrons having an energy equal to or less than E1, i.e., in an energy band of [0, E1], may be repelled by the first repelling mesh, and electrons having an energy greater than E1 may be transmitted by the first repelling mesh.

The system also includes a second repelling mesh configured to repel the charged particles that pass through the first repelling mesh and have an energy that is lower than a second predetermined energy. The second repelling mesh may also be configured so that any electrons having an energy higher than the second predetermined energy pass through the second repelling mesh. As shown in FIG. 1, the system may include second repelling mesh 106 configured to repel charged particles 108 that pass through first repelling mesh 100 and have an energy that is lower than the second predetermined energy by having a second voltage, V2, applied thereto. In other words, signal electrons having energies greater than E1 may pass through the first repelling mesh, and any of those electrons having energies in an energy band of [E1, E2] are repelled by the second repelling mesh. Any other of those charged particles, e.g., electrons 110, having energies greater than E2, i.e., [E2, Em], may not be repelled by the second repelling mesh, but may pass through that repelling mesh and may or may not be separately detected as described further herein. Therefore, the system may include one energy band (i.e., energies between E1 and E2) bandpass filter and one high pass energy band (i.e., energies greater than E2) filter, and the energy bands of both filters may be selectable by a user or as described further herein.

The system further includes a first attracting mesh configured to attract the charged particles that pass through the first repelling mesh, are repelled by the second repelling mesh, and have an energy that is higher than the first predetermined energy and lower than the second predetermined energy. As shown in FIG. 1, the system may include first attracting mesh 112 configured to attract the charged particles that pass through first repelling mesh 100, are repelled by second repelling mesh 106, and have an energy that is higher than the first predetermined energy and lower than the second predetermined energy, i.e., [E1, E2]. The first attracting mesh may attract the electrons having such energies by having a voltage of V1+ΔV applied thereto.

For both the first and second repelling meshes, their applied voltages, V1 and V2, respectively, are negative for electrons due to their repelling nature. Therefore, the value of V1 is usually larger than V2. V1+ΔV will also be larger than V2 so that the first attracting mesh can attract electrons repelled from the second repelling mesh. It is also noted that ΔV can be equal to zero, which means that the first repelling mesh is at the same potential as the first attracting mesh, which can help simplify the external power supplies and mechanical design.

The first and second repelling meshes and the first attracting mesh shown in FIG. 1 form one of multiple possible energy band cavities that may be included in the embodiments described herein. A "cavity" as that term is used herein is generally defined as a defined space formed by some combination of repelling and attracting meshes (possibly with one or more additional elements such as electrode block(s)) that, in combination, control the flow of charged particles through the defined space. Each of the energy band cavities described herein is configured such that it not only stores the electrons with its corresponding, desired energy band but also deflects them into a side detector automatically without adding an additional deflector. The curved lines shown in energy band cavity 114 of FIG. 1 formed by first repelling mesh 100, second repelling mesh 106, and first attracting mesh 112 are simulated equipotential lines for one embodiment of the energy band cavity, which may vary depending on the exact configuration of the elements that form the energy band cavity.

In this manner, the energy band cavity is used to create a space that only electrons with energies in the desired energy band stay and are deflected to a side attracting mesh and then accelerate to a detector (described further herein), e.g., because the detector will be more positively biased compared to the side attracting mesh, with enough impacting energies to generate relatively strong signals. One improvement of the embodiments described herein over other methods and systems for detecting charged particles from a specimen is the inclusion of an energy band cavity configured as described herein. One advantage of the embodiments described herein is that they can precisely select any specific energy band of signal electrons to generate images using the energy band cavities described herein. Another advantage of the embodiments described herein is that the transmission rate of a selected energy band is substantially high (e.g., greater than 80%) using the energy band cavities described herein.

Figure 2:
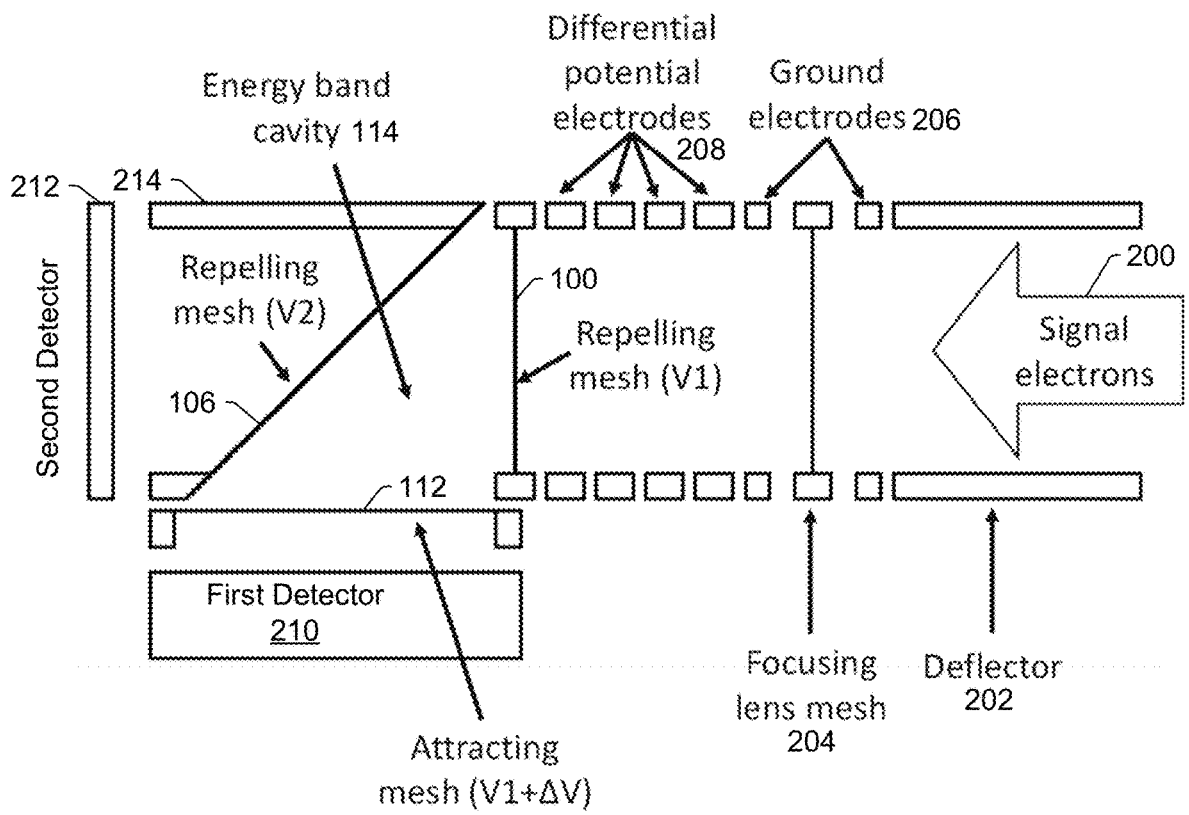
FIG. 2 is a schematic diagram illustrating a cross-sectional view of an embodiment of a triangular energy band cavity included in an embodiment of a system configured to detect charged particles from a specimen.

FIG. 2 illustrates one embodiment of the system that includes a deflector, a focusing lens, differential potential electrodes, an energy band cavity, and two detectors. In this embodiment, energy band cavity 114 formed by first repelling mesh 100, second repelling mesh 106, and first attracting mesh 112 may be configured as described further above. In one embodiment, the system includes a deflector configured to alter a position of the path of the charged particles from the specimen before the charged particles reach the first repelling mesh. As shown in FIG. 2, signal electrons 200 from a specimen (not shown in FIG. 2) pass through deflector 202. The deflector may be configured to center the signal electrons cloud to the center of the focusing lens and also to minimize the position offsets of electron clouds due to the scanning field of view of the specimen and deflection from the scanning deflectors.

In one such embodiment, the system includes a focusing lens configured to focus the charged particles from the deflector and to collimate the charged particles having an energy that is higher than the first predetermined energy and lower than the second predetermined energy to pass through the first repelling mesh. For example, after signal electrons 200 pass through deflector 202, they may pass through focusing lens mesh 204 positioned between ground electrodes 206. The focusing lens may be configured to focus the electron cloud and collimate the electrons with the desired energies to pass through the first repelling mesh. In this manner, the focusing lens may help to minimize the loss of electrons with energies slightly higher than the lower end energy of the desired energy band.

Figure 3:
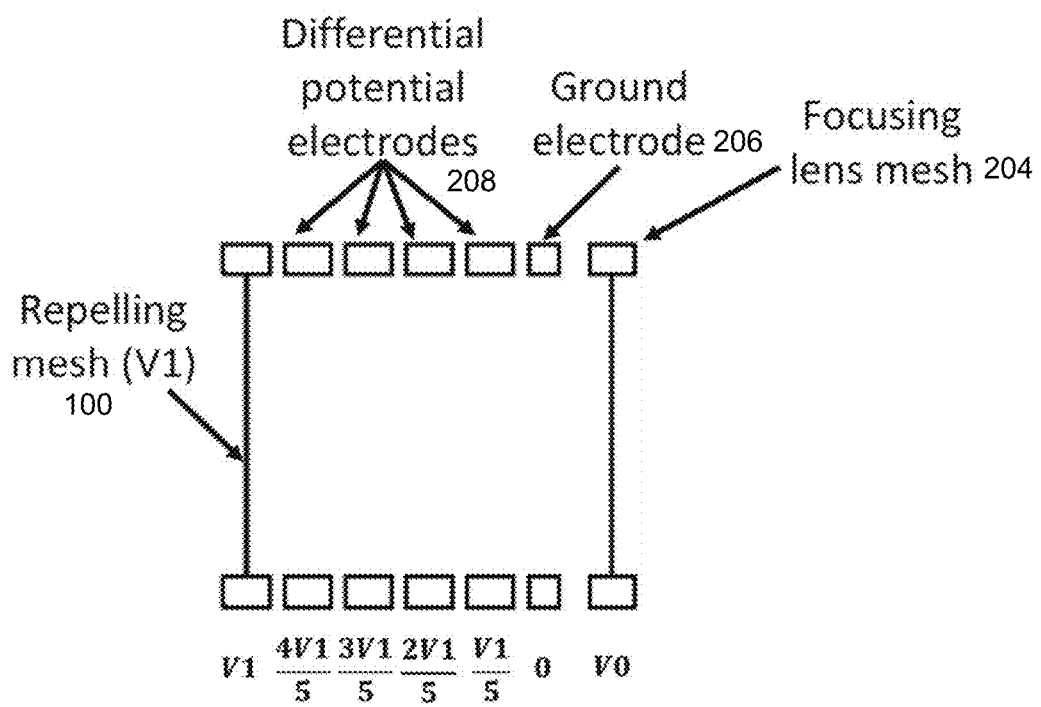
FIG. 3 is a schematic diagram illustrating a cross-sectional view of an embodiment of differential potential electrodes that may be included in embodiments of the system described herein.

In some such embodiments, the system includes differential potential electrodes surrounding the path of the charged particles between the focusing lens and the first repelling mesh. As shown in FIG. 2, the system may include differential potential electrodes 208 surrounding the path of signal electrons 200 between focusing lens mesh 204 and first repelling mesh 100. As shown in FIG. 3, the differential potential electrodes may include four electrodes arranged in series along the path of the charged particles between focusing lens mesh 204 and first repelling mesh 100. The voltages below each of the elements shown in FIG. 3 are examples of applied voltages for each of these elements. In particular, the applied voltage for the focusing lens mesh may be V0. The voltage applied to the ground electrode may be 0, and the voltage applied to the first repelling mesh may be V1. The voltages applied to the first, second, third and fourth differential potential electrodes may be $$\frac{V1}{5}, \frac{2V1}{5}, \frac{3V1}{5}, \text{ and } \frac{4V1}{5},$$

respectively.

One improvement of the embodiments described herein over other methods and systems for detecting charged particles from a specimen is the inclusion of the differential potential electrodes. For example, positioning the differential potential electrodes in front of the first repelling mesh can help minimize the loss of "useful" electrons, i.e., reduce the loss of electrons with energies slightly larger than E1, which are some of the "useful electrons" that are in an energy band of [E1, E2], and increase the energy filtering resolution of the first repelling mesh.

Figure 4:
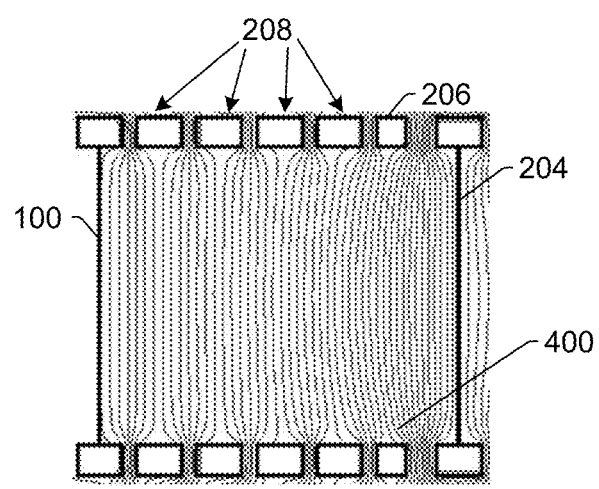
FIG. 4 is a schematic diagram illustrating a cross-sectional view of the differential potential electrodes of FIG. 3 with one example of simulated equipotential lines caused by and created within the differential potential electrodes.

In another such embodiment, the differential potential electrodes are configured for reducing formation of a lensing field between the focusing lens and the first repelling mesh. In addition, the differential potential electrodes may be configured to prevent the formation of a lensing field between the focusing lens mesh and the first repelling mesh. For example, equipotential lines 400 shown in FIG. 4 show that there is almost no lensing field between the focusing lens mesh and the first repelling mesh. Although the differential potential electrodes are shown in various figures described herein as including 4 differential potential electrodes, any suitable number of differential potential electrodes may be included in the embodiments described herein between the focusing lens mesh and the first repelling mesh.

The system also includes a first detector configured to generate output responsive to the charged particles that pass through the first attracting mesh. For example, as shown in FIG. 2, the system may include first detector 210 configured to generate output responsive to the electrons that pass through first attracting mesh 112. First detector 112 (and other detectors described herein) may include any suitable detectors known in the art. Each of the detectors described herein may be imaging detectors that are configured to detect charged particles as a function of position across the detectors. However, the detectors may be non-imaging detectors that do not output images of the specimen and detect number of impacting electrons and impacting energies. In some such embodiments, a computer subsystem such as that described herein may be configured to generate an image of the specimen from the non-imaging output of the detectors. In this manner, the embodiments described herein may be configured to generate images of the specimen in different ways and generating images of the specimen is not necessary for some of the system configurations described further herein.

In one embodiment, the first detector is grounded. In another embodiment, the first detector is biased with a positive voltage. In a further embodiment, the first detector is biased with a voltage that is tunable. For example, the first detector (and any other detectors described herein) may be grounded or biased with positive, relatively high voltages (e.g., a few kV) for reaching optimum impacting energies of electrons for any type of detectors, such as semiconductor-based, microchannel plate, and scintillator-photomultiplier tube (PMT) detectors. One improvement provided by the embodiments described herein over other systems and methods for detecting charged particles from a specimen is that the detectors can have tunable voltages for optimization of impacting energies. In addition, one advantage of the embodiments described herein is that the impacting energies of electrons hitting on detectors are relatively high (e.g., greater than 5 keV) and tunable without affecting the energy band filtering performance.

In one embodiment, the first detector is biased with a voltage, and the first attracting mesh shields the space between the first repelling mesh, the second repelling mesh, and the first attracting mesh from an electrical field from the detector. For example, the meshes in front of the detectors behave like shielding meshes so that the relatively high electrical fields from detectors cannot affect the performance of the energy band cavity.

In some embodiments, the system includes a second detector configured to detect the charged particles that pass through the second repelling mesh. For example, as shown in FIG. 2, the system may include second detector 212 configured to detect electrons that pass through second repelling mesh 106. This detector may be further configured as described herein. If the system includes multiple detectors, each of the detectors may have the same or different configurations, e.g., depending on the energies and/or types of the electrons they are going to detect. In this manner, the embodiments may include two detectors: one may be used for collecting and detecting the electrons within the desired energy band (i.e., bandpass filtering) while another one may be used for collecting and detecting electrons with energies higher than the high-end energy of the desired energy band (i.e., high pass filtering).

In some embodiments such as those shown in FIG. 2, the system may include electrode block 214 configured to facilitate the detection of as many of the signal electrons that pass through the second repelling mesh by the second detector by at least partially enclosing the space between the second repelling mesh and the second detector. In this manner, second repelling mesh 106, electrode block 214, and second detector 212 (possibly with an attracting mesh positioned in front of it, not shown in FIG. 2) may form a kind of second energy band cavity in the system. That second energy band cavity may be further configured as described herein.

Figure 5:
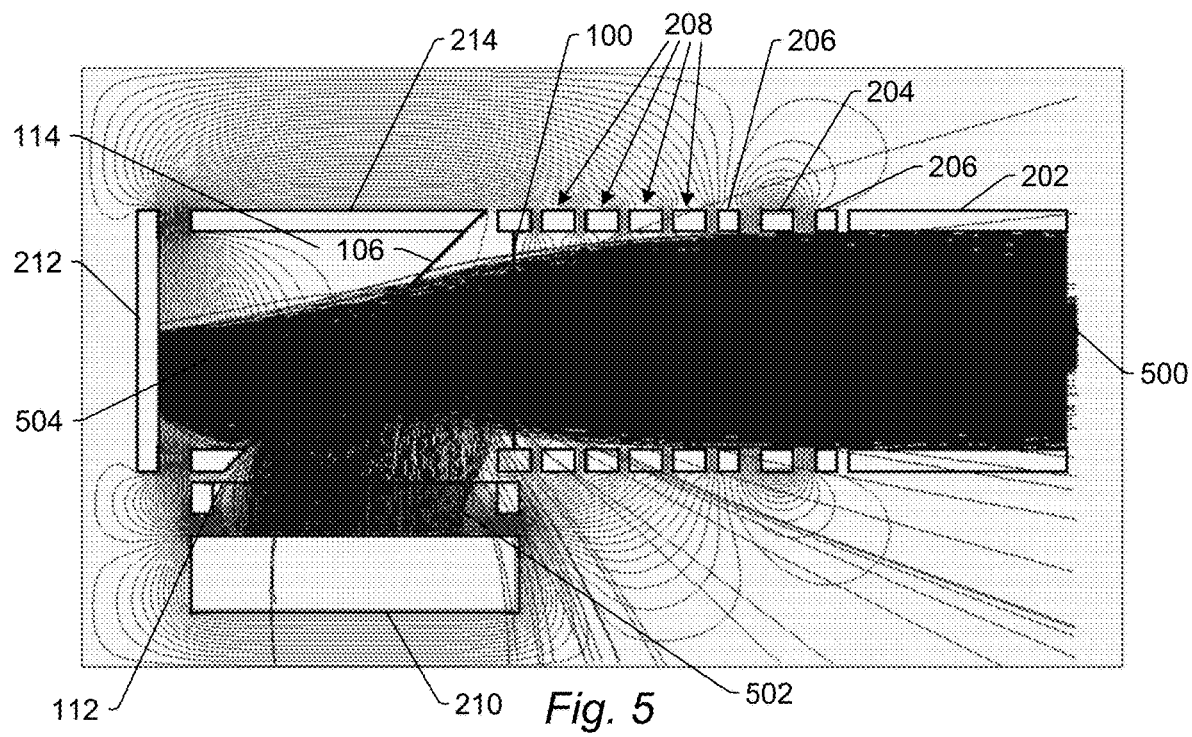
FIGS. 5 and 6 are schematic diagrams illustrating a cross-sectional view of the embodiment of FIG. 2 with examples of simulations of the paths of charged particles with various energies through the system.
Figure 6:
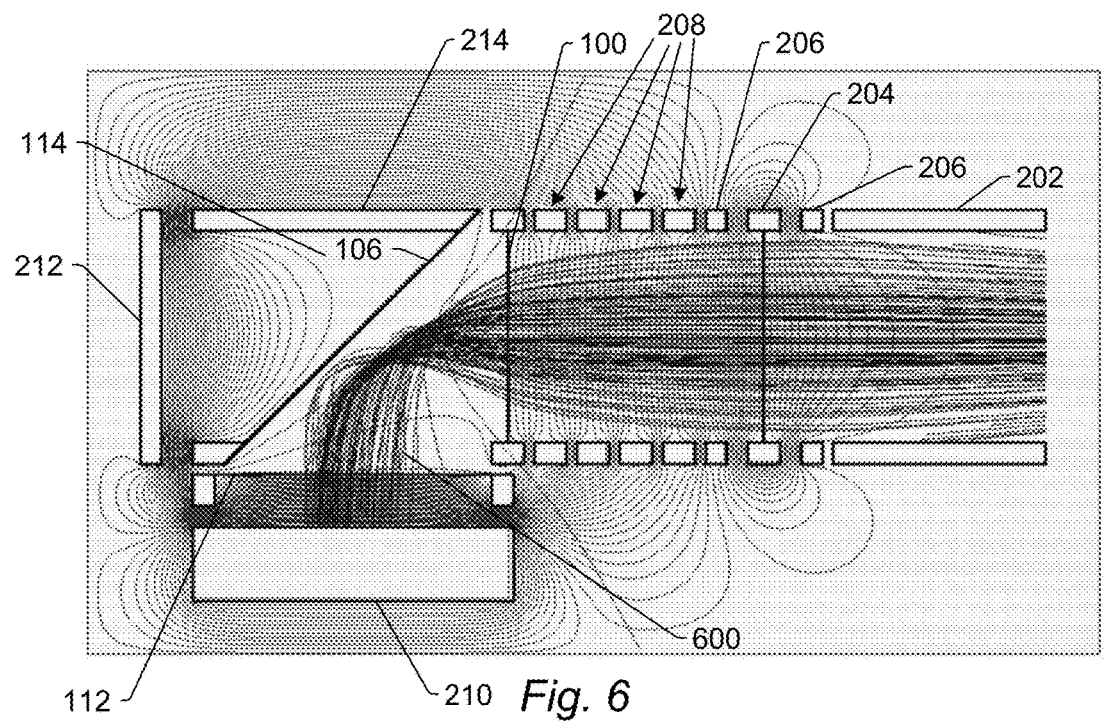

FIGS. 5 and 6 show simulation results of the paths of charged particles having different energies through the system embodiment of FIG. 2. FIG. 5 shows the paths of electrons having energies within a band of [0, Em]. In other words, FIG. 5 shows the simulated paths of all electrons entering into the detector assembly of FIG. 2. In contrast, FIG. 6 shows only the electrons that are collected by the first detector. These electrons having energies within the band [E1, E2] are only a portion of electrons that are shown in FIG. 5. In other words, FIG. 6 shows the paths of only the electrons within a specific energy band entering into the detector assembly. Therefore, FIG. 6 is included here to more clearly illustrate the movement of the electrons in the bandpass filter energy band through the system, but is not meant to illustrate all of the electrons that would in practice move through the system.

As shown in FIG. 5, electrons 500 with energies lower than E1 are repelled back by the first repelling mesh. Electrons 502 with energies between E1 and E2 are collected on first detector 210. Electrons 504 with energies higher than E2 are collected on second detector 212. As more clearly shown in FIG. 6, electrons 600 with energies between E1 and E2 are collected on first detector 210 with a substantially high transmission rate (i.e., nearly all of the electrons with energies in the bandpass corresponding to the first energy band cavity are directed to the first detector).

In one embodiment, the first repelling mesh, the second repelling mesh, and the first attracting mesh form a triangular energy band cavity (e.g., as shown in FIGS. 1 and 2). In another embodiment, the first repelling mesh, the second repelling mesh, and the first attracting mesh form at least a portion of a square energy band cavity. In this manner, there are two versions of the energy band cavity: triangular and rectangular. Both versions employ three meshes with three potentials (V1, V2, and V1+ΔV) and a surrounding enclosure with the same potential as V2. For example, in a further embodiment, the first repelling mesh, the second repelling mesh, the first attracting mesh, and an electrode block form a square energy band cavity, and the second repelling mesh and the electrode block have the same potential.

Figure 7:
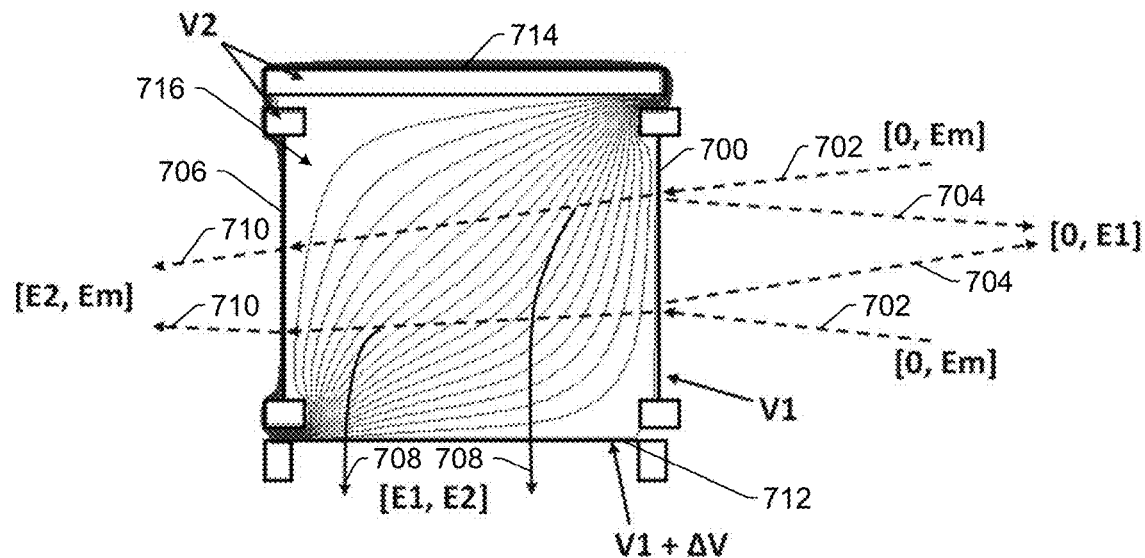
FIG. 7 is a schematic diagram illustrating a cross-sectional view of an embodiment of a square energy band cavity.

FIG. 7 illustrates one embodiment of an energy band cavity having a square configuration. As shown in FIG. 7, the system may include first repelling mesh 700 positioned in a path of charged particles 702 from a specimen (not shown in FIG. 7). The first repelling mesh repels charged particles 704 having an energy lower than the first predetermined energy by having a first voltage, V1, applied thereto. In other words, signal electrons from a specimen having a variety of energies [0, Em] may encounter the first repelling mesh, electrons having an energy in an energy band of [0, E1] may be repelled by the first repelling mesh, and electrons having an energy greater than E1 may be transmitted by the first repelling mesh.

The system also includes a second repelling mesh configured to repel the charged particles that pass through the first repelling mesh and have an energy that is lower than a second predetermined energy. The second repelling mesh may be configured so that any electrons having an energy higher than the second predetermined energy pass through the second repelling mesh. As shown in FIG. 7, the system may include second repelling mesh 706 configured to repel charged particles 708 that pass through first repelling mesh 700 and have an energy that is lower than the second predetermined energy by having a second voltage, V2, applied thereto. In other words, signal electrons having energies greater than E1 may pass through the first repelling mesh, and any of those electrons having energies in an energy band of [E1, E2] are repelled by the second repelling mesh. Electrons 710 having energies greater than E2, i.e., [E2, Em], may not be repelled by the second repelling mesh, but may be passed through that repelling mesh and may or may not be separately detected as described further herein. Therefore, the system may include one energy band (i.e., energies between E1 and E2) bandpass filter and one high pass energy band (i.e., energies greater than E2) filter, and the energy bands of both filters may be selectable by a user or as described further herein.

The system further includes a first attracting mesh configured to attract the charged particles that pass through the first repelling mesh, are repelled by the second repelling mesh, and have an energy that is higher than the first predetermined energy and lower than the second predetermined energy. As shown in FIG. 7, the system includes first attracting mesh 712 configured to attract the charged particles that pass through first repelling mesh 700, are repelled by second repelling mesh 706, and have an energy that is higher than the first predetermined energy and lower than the second predetermined energy, i.e., [E1, E2]. The first attracting mesh may attract the electrons having such energies by having a voltage of V1+ΔV applied thereto.

In some embodiments such as that shown in FIG. 7, the system may include electrode block 714 that along with the first and second repelling meshes and the first attracting mesh shown in FIG. 7 form square energy band cavity 716. The electrode block may have the same applied voltage, V2, as the second repelling mesh. V1, V2, and V1+ΔV may be selected as described above. The curved lines shown in energy band cavity 716 of FIG. 7 are simulated equipotential lines for one embodiment of the energy band cavity, which may vary depending on the exact configuration of the elements that form the energy band cavity. This energy band cavity may be further configured as described herein and has all of the improvements and advantages of other energy band cavities described herein.

Figure 8:
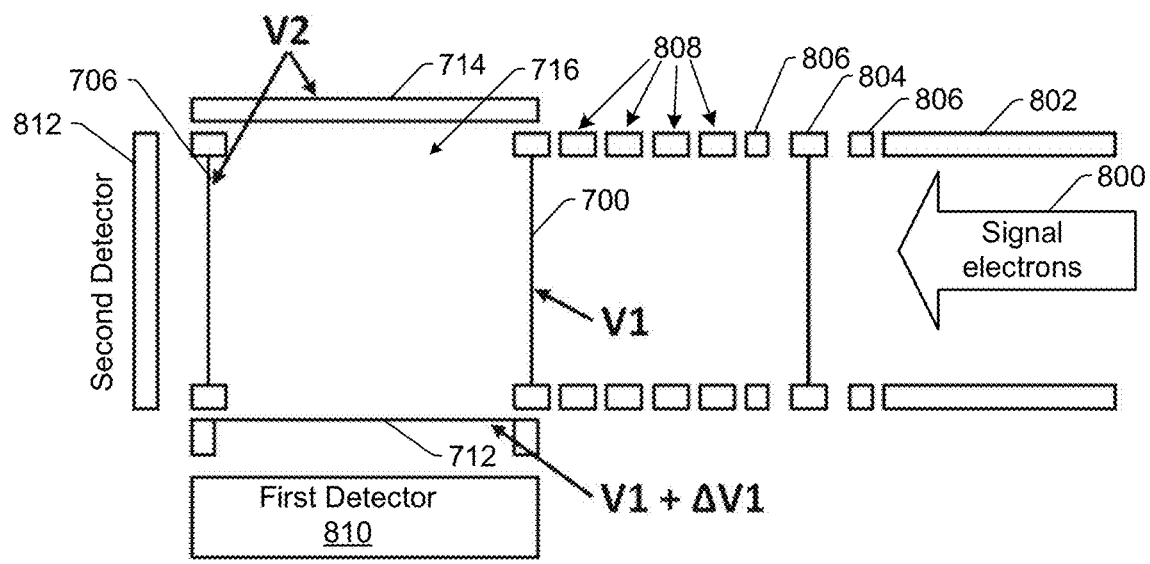
FIG. 8 is a schematic diagram illustrating a cross-sectional view of an embodiment of a square energy band cavity included in an embodiment of a system configured to detect charged particles from a specimen.

FIG. 8 illustrates one embodiment of the system that includes a deflector, a focusing lens, differential potential electrodes, a square energy band cavity, and two detectors. In this embodiment, energy band cavity 716 formed by first repelling mesh 700, second repelling mesh 706, first attracting mesh 712, and electrode block 714 may be configured as described further above. As shown in FIG. 8, signal electrons 800 from a specimen (not shown in FIG. 8) pass through deflector 802, which may be configured as described further herein. After signal electrons 800 pass through deflector 802, they may pass through focusing lens mesh 804 positioned between ground electrodes 806. The focusing lens mesh and ground electrodes may be configured as described further herein.

The system also includes differential potential electrodes 808 surrounding the path of signal electrons 800 between focusing lens mesh 804 and first repelling mesh 700. The differential potential electrodes may be configured as described further herein. The system also includes a first detector configured to generate output responsive to the charged particles that pass through the first attracting mesh. For example, as shown in FIG. 8, the system may include first detector 810 configured to generate output responsive to the electrons that pass through first attracting mesh 712. First detector 810 may be further configured as described herein.

In some embodiments, the system includes a second detector configured to detect the charged particles that pass through the second repelling mesh. For example, as shown in FIG. 8, the system may include second detector 812 configured to detect electrons that pass through second repelling mesh 706. In this manner, the embodiments may include two detectors: one may be used for collecting the electrons within the desired energy band (i.e., bandpass filtering) while another one may be used for collecting electrons with energies higher than the high-end energy of the desired energy band (i.e., high pass filtering). The second detector may be further configured as described herein.

Figure 9:
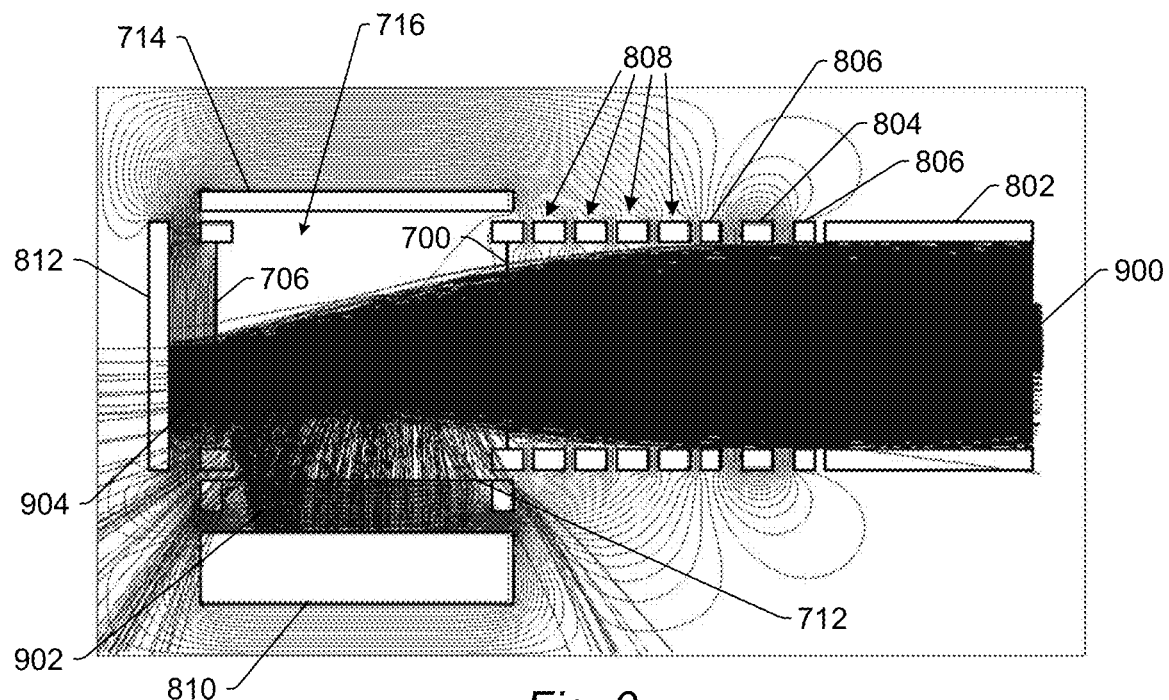
FIGS. 9 and 10 are schematic diagrams illustrating a cross-sectional view of the embodiment of FIG. 8 with examples of simulations of the paths of charged particles with various energies through the system.
Figure 10:
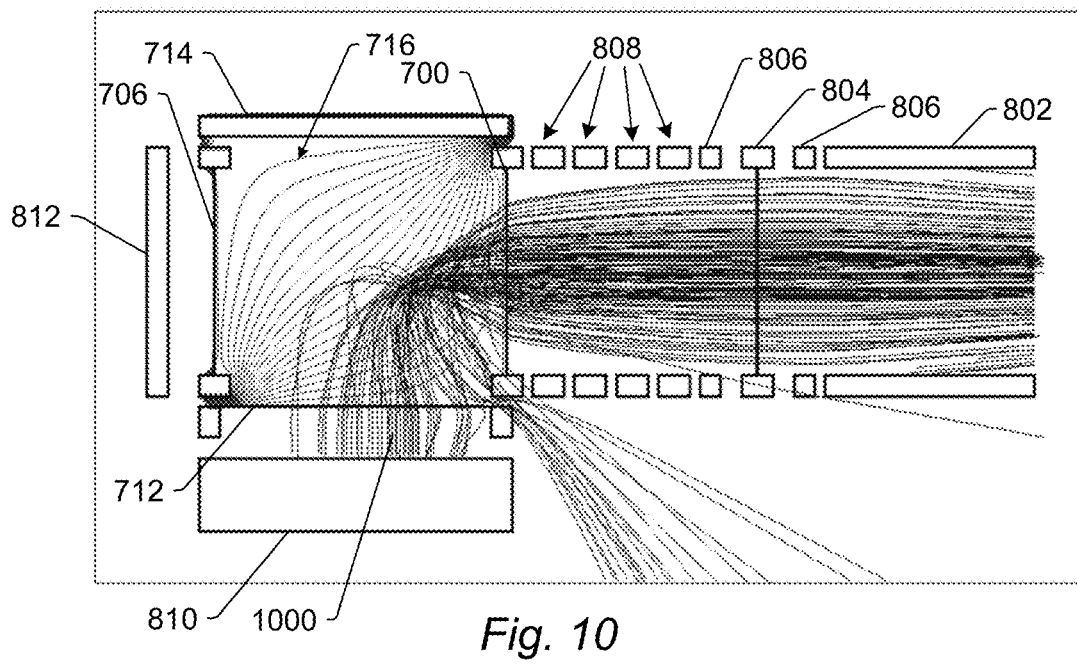

FIGS. 9 and 10 show simulation results of the paths of charged particles having different energies through the system embodiment of FIG. 8. FIG. 9 shows the paths of electrons having energies within a band of [0, Em]. In other words, FIG. 9 shows the simulated paths of all electrons entering into the detector assembly of FIG. 8. In contrast, FIG. 10 shows only the electrons that are collected by the first detector. These electrons having energies within the band [E1, E2] are only a portion of electrons that are shown in FIG. 9. In other words, FIG. 10 shows the paths of only electrons within a specific energy band entering into the detector assembly. Therefore, FIG. 10 is included here to more clearly illustrate the movement of the electrons in the bandpass filter energy band through the system, but is not meant to illustrate all of the electrons that would in practice move through the system.

As shown in FIG. 9, electrons 900 with energies lower than E1 are repelled back by the first repelling mesh. Electrons 902 with energies between E1 and E2 are collected on first detector 810. Electrons 904 with energies higher than E2 are collected on second detector 812. As more clearly shown in FIG. 10 electrons 1000 with energies between E1 and E2 are collected on first detector 810 with a substantially high transmission rate (i.e., nearly all of the electrons with energies in the bandpass corresponding to the first energy band cavity are directed to the first detector).

Figure 11:
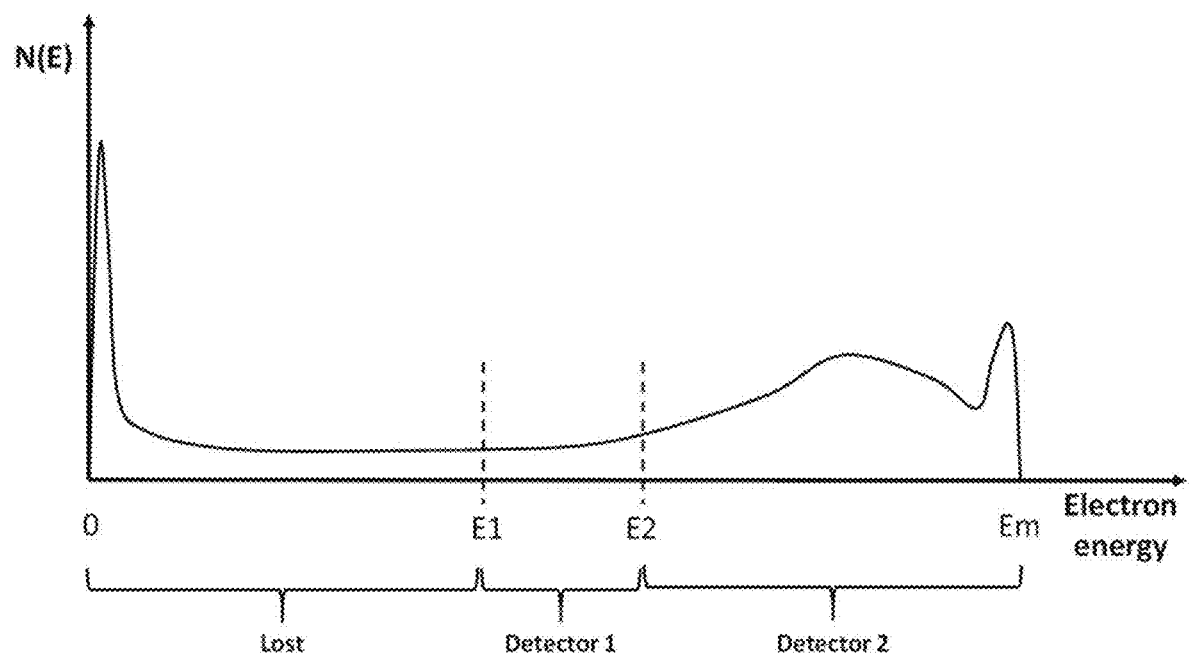
FIG. 11 is a plot illustrating one example of how the energy band cavity embodiments described herein can be used in the system embodiments described herein to separately detect charged particles having different energies.

FIG. 11 illustrates a general collection spectrum for the detector assemblies described above that include first and second detectors. In other words, this plot shows one example of a general collection spectrum for a system that uses both bandpass filtering and high-pass filtering. In FIG. 11 (and FIGS. 12, 13, and 19), the electron energy is plotted on the x axis with the number of electrons N(E) plotted on the y axis, E1=−eV1 and E2=−eV2, where e is charge of electron, and Em is the maximum emitting energy of electrons from the specimen, which is typically equal to the landing energy of the primary electrons. As shown in FIG. 11, a number of the electrons having energies between 0 and E1 are "lost," meaning that the detector assemblies described herein filter these electrons out via the first repelling mesh and they are not detected. Electrons having energies between E1 and E2 are detected by detector 1 because these electrons are not repelled by the first repelling mesh, are repelled by the second repelling mesh, and are attracted by the first attracting mesh positioned in front of the first detector. Electrons having energies between E2 and Em are detected by detector 2 because these electrons are not repelled by the first or second repelling mesh and therefore can be detected by the second detector.

In one embodiment, an energy band between the first and second predetermined energies is equal to an energy band of 0 eV to 50 eV. In another embodiment, an energy band between the first and second predetermined energies is equal to an energy band of Em-100 eV, and Em is a maximum emitting charged particle energy from the specimen. In a further embodiment, an energy band between the first and second predetermined energies is equal to an energy band of 50 eV-Em, and Em is a maximum emitting charged particle energy from the specimen.

In another embodiment, the first and second predetermined energies are selected based on a type of defects to be detected on the specimen based on the output generated by the first detector. In particular, the embodiments advantageously have the capability to select any specific energy band for returned charged particle signals, which can then be used for generating specimen images with enhanced contrast of any specific defects. In one such example, the signal electrons emitting from a sample may include secondary electrons (SE) and backscattered electrons (BSE) having energies ranging from 0 eV to Em (Em=e*LE, where LE stands for landing energy of primary electrons). Normally, these signal electrons will be further accelerated by the potential difference (U) between column and specimen after leaving from the specimen and before reaching the detector. Therefore, the energies of electrons entering the detector assembly are [eU, eU+Em]. Now for example, if we want to collect electrons with emitting energies between 500 eV to 700 eV to enhance the contrast of defects that were buried near 100 nm in depth, then the voltage (V1) applied on the first repelling mesh should be equal to $-(eU+500)/e$, and the voltage (V2) applied on the second repelling mesh should be equal to $-(eU+700)/e$. The voltage $(V1+\Delta V)$ applied on the first attracting mesh should be $V1<=V1+\Delta V$, which means $\Delta V>=0V$. Therefore, electrons with residual energy within [0, 200] will be trapped inside the energy band cavity, and then be deflected to the first detector by the dipole field between the second repelling mesh and first attracting mesh. Assuming both detectors are grounded, the impacting energies of electrons hitting on the first detector are [eU+500, eU+700], and the impacting energies of electrons hitting on the second detector are [eU+700, eU+Em].

Figure 12:
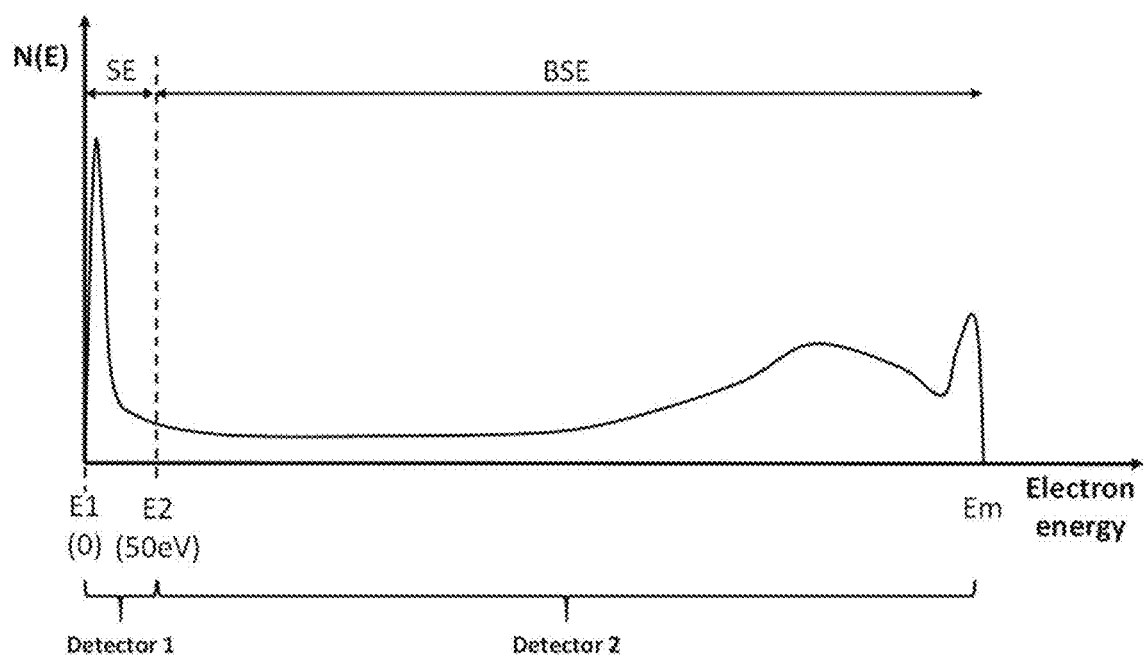
FIG. 12 is a plot illustrating one example of how the energy band cavity embodiments described herein can be used in an embodiment of a system described herein to separately detect secondary electrons and backscattered electrons.

In some embodiments, the first and second predetermined energies are selected based on a type of the charged particles to be detected from the specimen. For example, FIG. 12 illustrates an extreme case of a collection spectrum for the detector assemblies described above that include first and second detectors. This plot shows one example of an extreme case of a collection spectrum for a system that separates SE and BSE. As shown in FIG. 12, SE having energies between E1 and E2, e.g., between 0 eV and 50 eV, are detected by detector 1 because these electrons are not repelled by the first repelling mesh, are repelled by the second repelling mesh, and are attracted by the first attracting mesh positioned in front of the first detector. BSE having energies between E2 and Em are detected by detector 2 because these electrons are not repelled by the first or second repelling mesh and therefore can be detected by the second detector.

Figure 13:
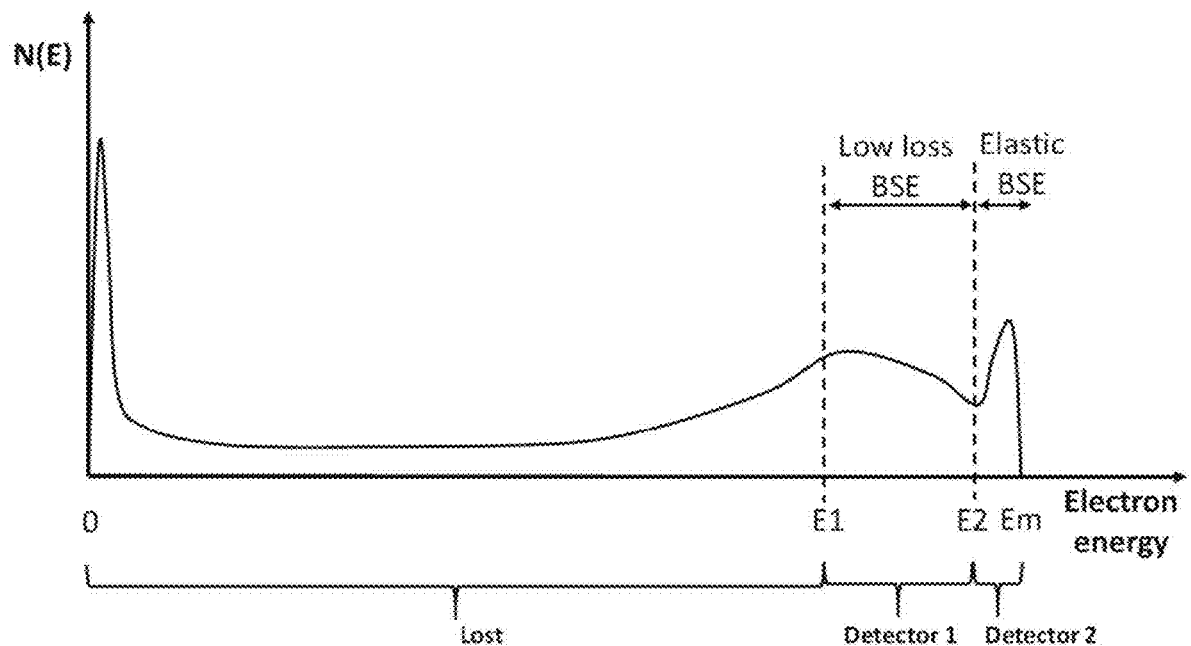
FIG. 13 is a plot illustrating one example of how the energy band cavity embodiments described herein can be used in an embodiment of a system described herein to separately detect low-loss backscattered electrons and elastic backscattered electrons.

FIG. 13 illustrates another extreme case of a collection spectrum for the detector assemblies described above that include first and second detectors. This plot shows one example of an extreme case of a collection spectrum for a system that separates low-loss BSE and elastic BSE. As shown in FIG. 13, a number of the electrons having energies between 0 and E1 are "lost," meaning that the detector assemblies described herein filter these electrons out via the first repelling mesh and they are not detected. Low-loss BSE having energies between E1 and E2 are detected by detector 1 because these electrons are not repelled by the first repelling mesh, are repelled by the second repelling mesh, and are attracted by the first attracting mesh positioned in front of the first detector. Elastic BSE having energies between E2 and Em are detected by detector 2 because these electrons are not repelled by the first or second repelling mesh and therefore can be detected by the second detector.

Figure 14:
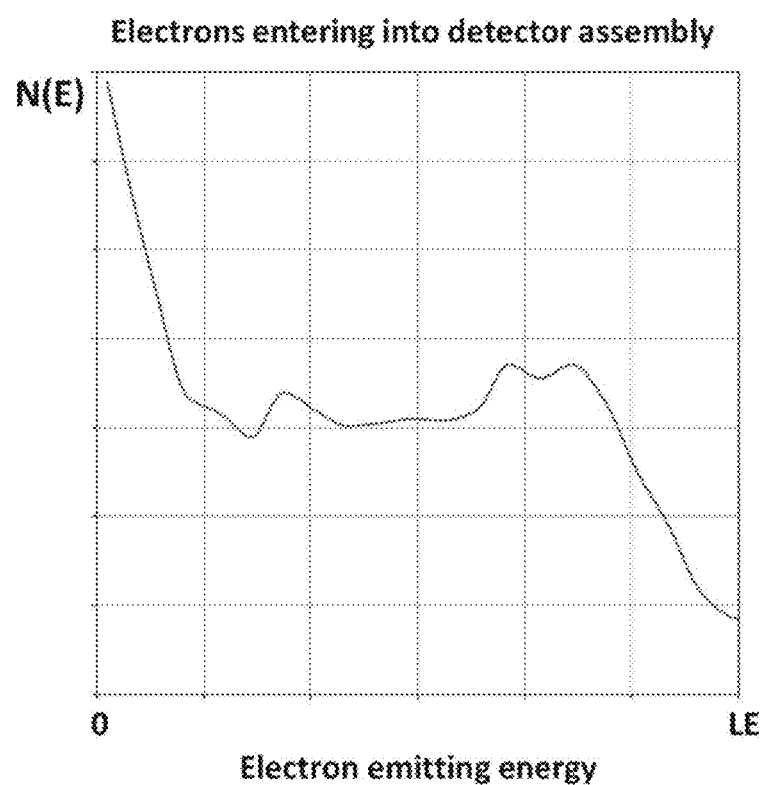
FIG. 14 is a plot illustrating one example of simulation results of energies of electrons entering into a detector assembly of a system embodiment described herein.
Figure 15:
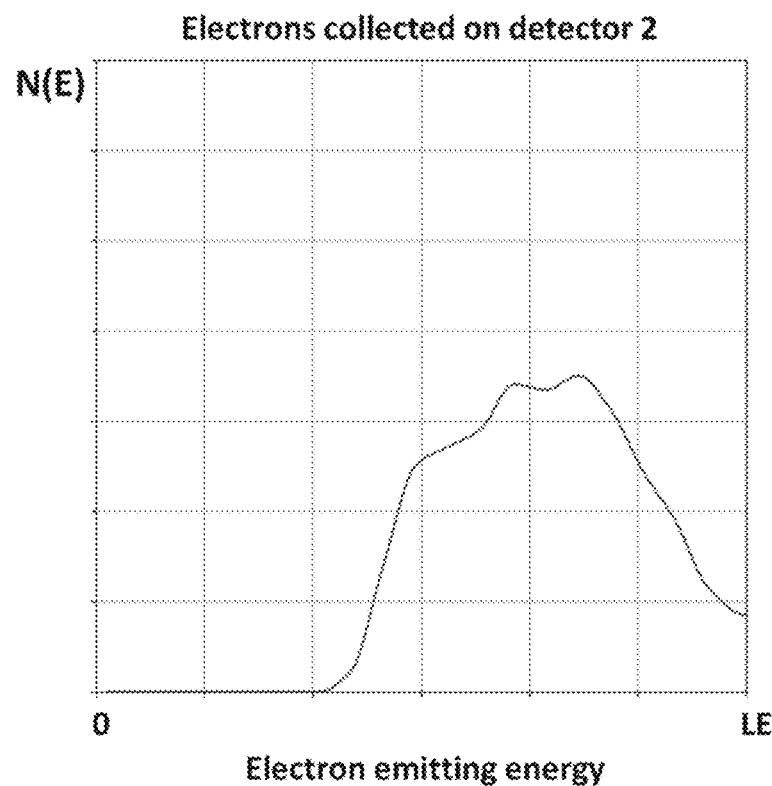
FIGS. 15 and 16 are plots illustrating examples of simulation results of energies of electrons separately detected by different detectors of a detector assembly of a system embodiment described herein.
Figure 16:
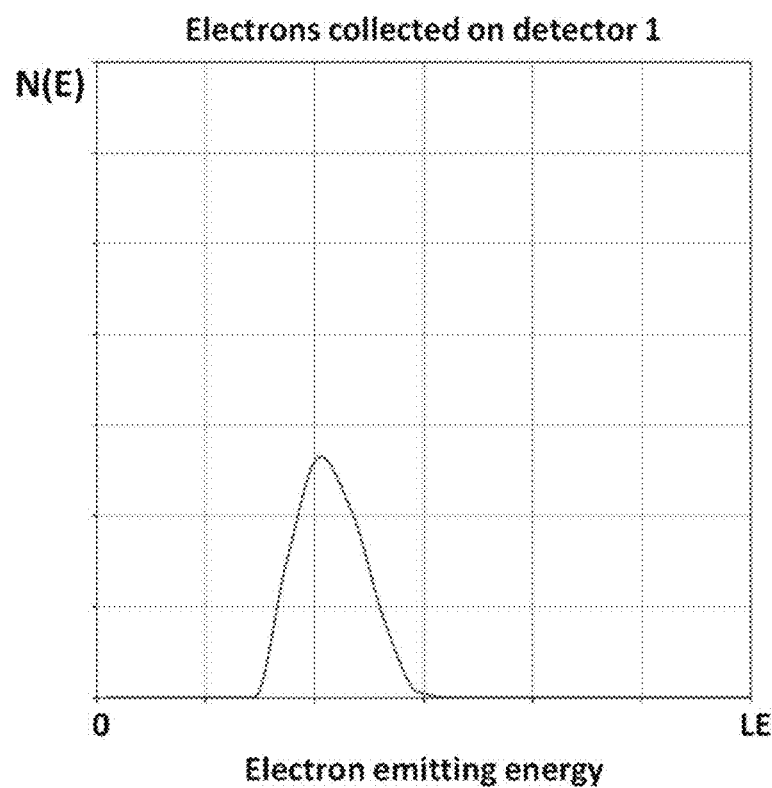

FIGS. 14-16 also show how BSE having different energies entering a detector assembly can be separated and separately detected by the embodiments described herein. In FIGS. 14-16, the electron emitting energy is plotted on the x axis, and the number of electrons, N(E), is plotted on the y axis. FIG. 14 shows the number of BSE having energies between 0 and LE entering into the detector assembly. FIG. 15 shows the number of BSE having energies between 0 and LE that are collected on the second detector, i.e., detector 2, and FIG. 16 shows the number of BSE having energies between 0 and LE that are collected on the first detector, i.e., detector 1.

In a further embodiment, an energy band between the first and second predetermined energies corresponds to energies of only secondary charged particles from the specimen, and the system includes a computer subsystem configured to detect surface or voltage contrast defects on the specimen based on the output generated by the first detector. For example, only collecting secondary electrons (e.g., in an energy band of 0-50 eV) may enhance contrast of surface or voltage contrast defects. For an electron beam inspection (EBI) system, finding defects with relatively high contrast on images has many benefits such as increasing the throughput and sensitivity, reducing the nuisance rate, and improving accuracy of artificial intelligence based models for the automatic defect catching. The computer subsystem of this embodiment may be further configured as described herein.

In another embodiment, an energy band between the first and second predetermined energies corresponds to energies of only elastic backscattering charged particles from the specimen, and the system includes a computer subsystem configured to detect high aspect ratio or materials contrast defects on the specimen based on the output generated by the first detector. In another example, only collecting elastic backscattering electrons (e.g., in an energy band of Em-100 eV, where Em is the maximum emitting electron energy from the specimen, which typically is equal to the landing energy of primary electrons) may enhance contrast of high aspect ratio (HAR) or materials contrast defects. Using the detector assembly embodiments described herein in e-beam wafer defect inspection systems such as the eSL10™ commercially available from KLA Corp., Milpitas, Calif. can help capture HAR defects (e.g., defects on the bottom deep hole and trench), which are unique defects that are difficult to catch. In addition, the detector assembly embodiments described herein can capture many different types of buried defects (such as punch-through to air spacer, worsen tungsten seam in replacement metal gate (RMG), residues between nanosheets, pun-through via, spacer nitride crack beside bit line, etc.). The computer subsystem of this embodiment may be further configured as described herein.

HAR defects may be defects in or on one or more 3D or HAR structures. In one embodiment, the 3D structure(s) include 3D NAND structure(s) formed on a wafer. 3D NAND (where NAND stands for not-AND, a type of logic gate in semiconductor devices) is a type of non-volatile flash memory that includes vertical stacks of multiple layers of memory cells. For example, the structure of 3D NAND generally includes silicon bit cell gates formed of alternating conductive and insulating layers formed on a wafer and separated by one or more HAR structures such as charge traps formed of materials like silicon nitride and channel(s) formed on silicon. That vertical stacking of the memory cells gives the 3D NAND structures their 3D quality.

The 3D structure(s) described herein may also include any other HAR structure known in the art. As used herein, the term "HAR structure" refers to any structure characterized by an aspect ratio that exceeds 10:1 and may be as high as 100:1 in future generation devices. HAR structures often include hard mask layers (see, for example, U.S. Pat. No. 8,237,213 to Liu issued on Aug. 7, 2012, which is incorporated by reference as if fully set forth herein) to facilitate etch processes for HARs. In addition to vertical NAND or terabit cell array transistor (TCAT) structures, the embodiments described herein can be used for other HAR structures whose defectivity is of interest.

In an additional embodiment, an energy band between the first and second predetermined energies corresponds to energies of only inelastic backscattering charged particles from the specimen, and the system includes a computer subsystem configured to detect buried defects on the specimen based on the output generated by the first detector. Only collecting inelastic backscattering electrons (e.g., any energy band within 50 eV-Em) may enhance contrast of buried defects (i.e., defects located entirely below an uppermost surface of the specimen). The computer subsystem of this embodiment may be further configured as described herein.

One new and advantageous feature of the embodiments described herein is that the energy band cavities can be cascaded (or arranged in series), which enables selection of multiple energy bands that can be separated and detected to generate different outputs or images at one time. In some embodiments, the system includes a third repelling mesh configured to repel the charged particles that pass through the second repelling mesh and have an energy that is lower than a third predetermined energy; a second attracting mesh configured to attract the charged particles that pass through the second repelling mesh, are repelled by the third repelling mesh, and have an energy that is higher than the second predetermined energy and lower than the third predetermined energy; and a second detector configured to generate output responsive to the charged particles that pass through the second attracting mesh.

Figure 17:
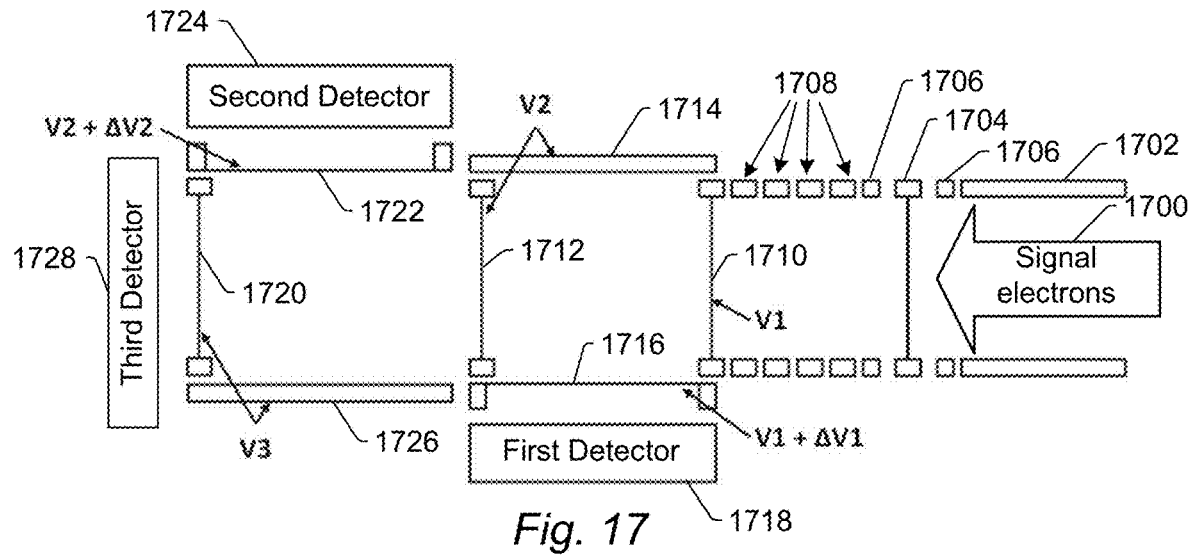
FIG. 17 is a schematic diagram illustrating a cross-sectional view of one embodiment of a system configured to detect charged particles from a specimen that includes an embodiment of multiple square energy band cavities.

FIG. 17 illustrates one embodiment in which multiple square energy band cavities are arranged in series. As shown in FIG. 17, signal electrons 1700 from a specimen (not shown in FIG. 17) may pass through deflector 1702, focusing lens mesh 1704 surrounded by ground electrodes 1706, and differential potential electrodes 1708, each of which may be configured as described further herein. The first energy band cavity of this system is formed by first repelling mesh 1710, second repelling mesh 1712, electrode block 1714, and first attracting mesh 1716, all of which may be configured as described further herein. This system includes first detector 1718, which may also be configured as described herein.

The system also includes third repelling mesh 1720 configured to repel the charged particles that pass through second repelling mesh 1712 and have an energy that is lower than a third predetermined energy. The third repelling mesh has an applied voltage, V3. Second attracting mesh 1722 is configured to attract the charged particles that pass through second repelling mesh 1712, are repelled by third repelling mesh 1720, and have an energy that is higher than the second predetermined energy, E2, and lower than the third predetermined energy, E3. The second attracting mesh has an applied voltage of V2+ΔV2. Second detector 1724 is configured to generate output responsive to the charged particles that pass through second attracting mesh 1722. The system may also include second electrode block 1726, which in combination with second repelling mesh 1712, third repelling mesh 1720, and second attracting mesh 1722 form a second square energy band cavity. The second electrode block has an applied voltage, V3. This system may further include third detector 1728 that is configured to generate output responsive to the charged particles that pass through third repelling mesh 1720. Each of these elements may also be further configured as described herein.

The system shown in FIG. 17 may, therefore, include two energy bands (i.e., energies between E1 and E2 and between E2 and E3) and one high pass band (i.e., energies greater than E3), all selectable by the user or as described further herein. In this manner, the embodiments described herein may add more energy band cavities as physical space in the tool allows.

Figure 18:
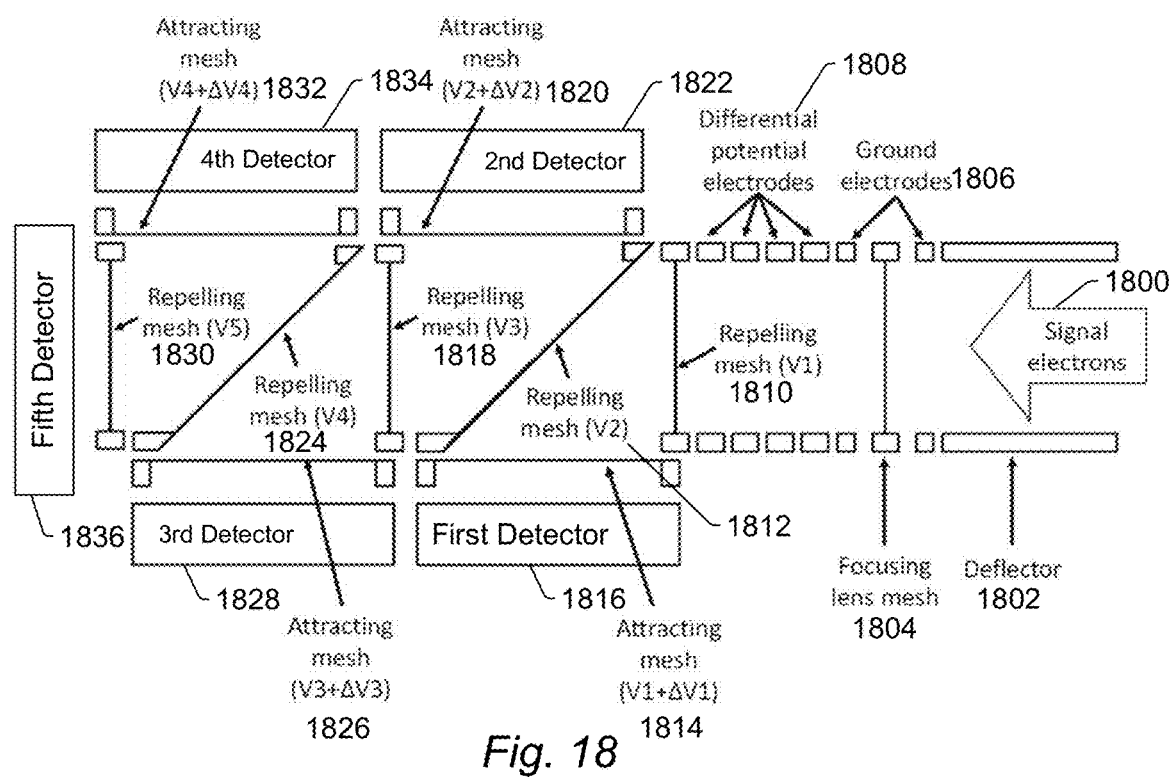
FIG. 18 is a schematic diagram illustrating a cross-sectional view of one embodiment of a system configured to detect charged particles from a specimen that includes an embodiment of multiple triangular energy band cavities.

Another such embodiment is shown in FIG. 18. In this embodiment, a series of triangular energy band cavities are cascaded so that two or more energy bands of electrons can be separately detected by the detector assembly. As shown in FIG. 18, signal electrons 1800 from a specimen (not shown in FIG. 18) may pass through deflector 1802, focusing lens mesh 1804 surrounded by ground electrodes 1806, and differential potential electrodes 1808, each of which may be configured as described further herein. The first energy band cavity of this system is formed by first repelling mesh 1810, second repelling mesh 1812, and first attracting mesh 1814, all of which may be configured as described further herein. This system includes first detector 1816, which may also be configured as described herein.

The system also includes third repelling mesh 1818 configured to repel the charged particles that pass through second repelling mesh 1812 and have an energy that is lower than a third predetermined energy. The third repelling mesh has an applied voltage, V3. Second attracting mesh 1820 is configured to attract the charged particles that pass through second repelling mesh 1812, are repelled by third repelling mesh 1818, and have an energy that is higher than the second predetermined energy, E2, and lower than the third predetermined energy, E3. The second attracting mesh has an applied voltage of V2+ΔV2. Second detector 1822 is configured to generate output responsive to the charged particles that pass through second attracting mesh 1820. Each of these elements may also be further configured as described herein.

In a further embodiment, the system includes a fourth repelling mesh configured to repel the charged particles that pass through the third repelling mesh and have an energy that is lower than a fourth predetermined energy; a third attracting mesh configured to attract the charged particles that pass through the third repelling mesh, are repelled by the fourth repelling mesh, and have an energy that is higher than the third predetermined energy and lower than the fourth predetermined energy; and a third detector configured to generate output responsive to the charged particles that pass through the third attracting mesh. For example, as shown in FIG. 18, the system may include fourth repelling mesh 1824 configured to repel the charged particles that pass through third repelling mesh 1818 and have an energy that is lower than fourth predetermined energy, E4. The fourth repelling mesh has an applied voltage, V4. Third attracting mesh 1826 is configured to attract the charged particles that pass through third repelling mesh 1818, are repelled by fourth repelling mesh 1824, and have an energy that is higher than the third predetermined energy, E3, and lower than the fourth predetermined energy, E4. The third attracting mesh has an applied voltage of V3+ΔV3. Third detector 1828 is configured to generate output responsive to the charged particles that pass through third attracting mesh 1826. Each of these elements may also be further configured as described herein.

In an additional embodiment, the system includes a fifth repelling mesh configured to repel the charged particles that pass through the fourth repelling mesh and have an energy that is lower than a fifth predetermined energy; a fourth attracting mesh configured to attract the charged particles that pass through the fourth repelling mesh, are repelled by the fifth repelling mesh, and have an energy that is higher than the fourth predetermined energy and lower than the fifth predetermined energy; and a fourth detector configured to generate output responsive to the charged particles that pass through the fourth attracting mesh. For example, as shown in FIG. 18, the system may include fifth repelling mesh 1830 configured to repel the charged particles that pass through fourth repelling mesh 1824 and have an energy that is lower than fifth predetermined energy, E5. The fifth repelling mesh has an applied voltage, V5. Fourth attracting mesh 1832 is configured to attract the charged particles that pass through fourth repelling mesh 1824, are repelled by fifth repelling mesh 1830, and have an energy that is higher than the fourth predetermined energy, E4, and lower than the fifth predetermined energy, E5. The fourth attracting mesh has an applied voltage of V4+ΔV4. Fourth detector 1834 is configured to generate output responsive to the charged particles that pass through fourth attracting mesh 1832. Each of these elements may also be further configured as described herein.

In some embodiments, the system includes a fifth detector configured to generate output responsive to the charged particles that pass through the fifth repelling mesh. For example, as shown in FIG. 18, fifth detector 1836 is configured to generate output responsive to the charged particles that pass through fifth repelling mesh 1830. This detector may also be further configured as described herein.

Therefore, the system may include four energy bands (i.e., energies between E1 and E2, between E2 and E3, between E3 and E4, and between E4 and E5) and one high pass band (i.e., energies greater than E5), all selectable by the user or as described further herein. In this manner, the embodiments described herein may add more energy band cavities as physical space in the tool allows.

Figure 19:
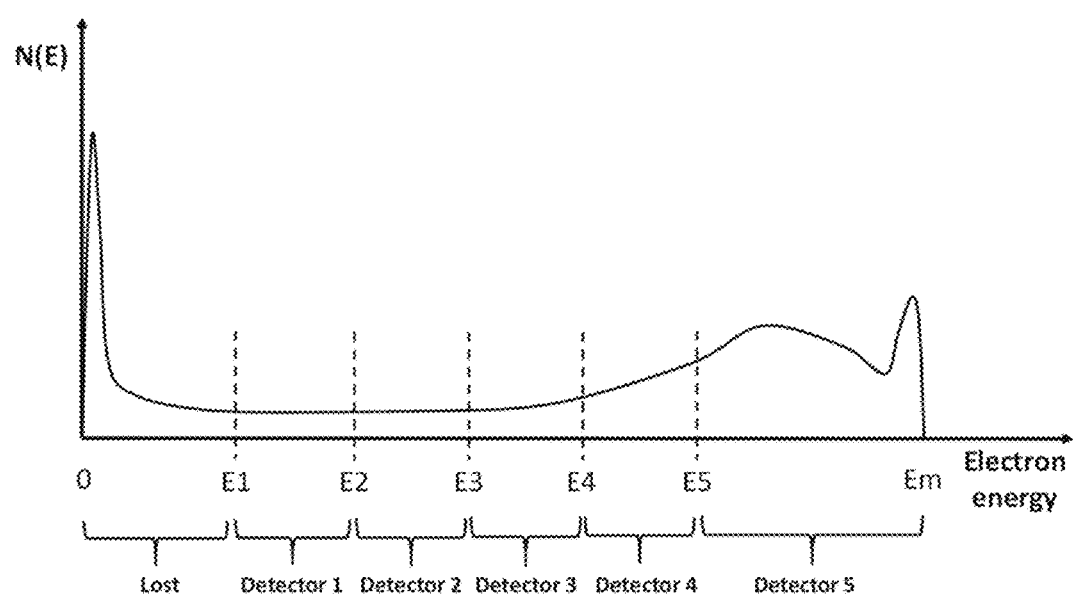
FIG. 19 is a plot illustrating one example of how the energy band cavity embodiment shown in FIG. 18 can be used in the system embodiments described herein to separately detect charged particles having different energies.

FIG. 19 illustrates a general collection spectrum for the detector assembly described above that includes 5 detectors. In other words, this plot shows one example of a general collection spectrum for a system that uses both bandpass filtering and high-pass filtering. As shown in FIG. 19, a number of the electrons having energies between 0 and E1 are "lost," meaning that the detector assemblies described herein filter these electrons out via the first repelling mesh and they are not detected. Electrons having energies between E1 and E2 are detected by detector 1 because these electrons are not repelled by the first repelling mesh, are repelled by the second repelling mesh, and are attracted by the first attracting mesh positioned in front of the first detector. Electrons having energies between E2 and E3 are detected by detector 2 because these electrons are not repelled by the first or second repelling mesh, are repelled by the third repelling mesh, and are attracted by the second attracting mesh positioned in front of the second detector. Electrons having energies between E3 and E4 are detected by detector 3 because these electrons are not repelled by the first, second, or third repelling meshes, are repelled by the fourth repelling mesh, and are attracted by the third attracting mesh positioned in front of the third detector. Electrons having energies between E4 and E5 are detected by detector 4 because these electrons are not repelled by the first, second, third, or fourth repelling meshes, are repelled by the fifth repelling mesh, and are attracted by the fourth attracting mesh positioned in front of the fourth detector. Electrons having energies between E5 and Em are detected by detector 5 because these electrons are not repelled by the first, second, third, fourth, or fifth repelling meshes and therefore can be detected by the fifth detector.

Figure 20:
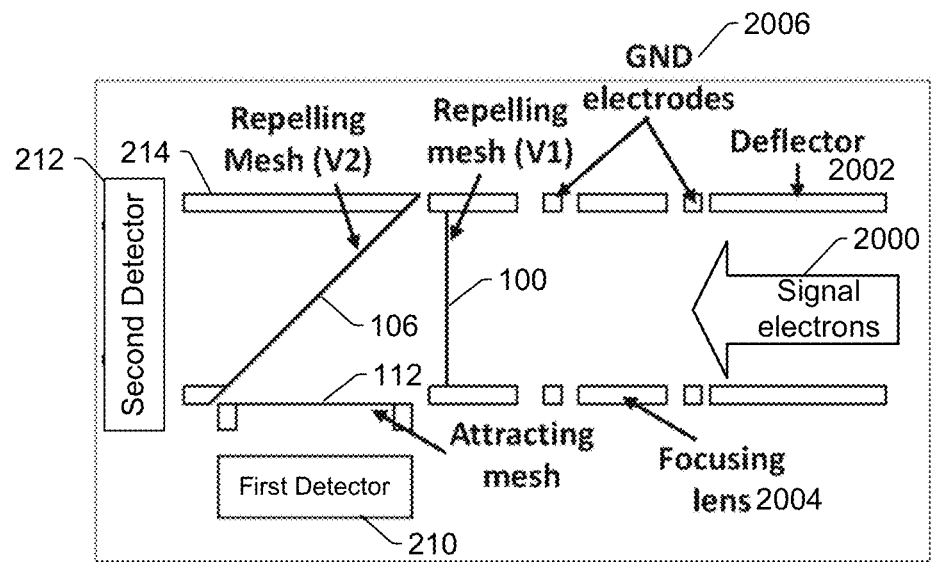
FIG. 20 is a schematic diagram illustrating a cross-sectional view of one embodiment of the system of FIG. 2 without differential potential electrodes.

FIG. 20 illustrates one alternative embodiment of the system of FIG. 2 that does not include differential potential electrodes. As shown in FIG. 20, signal electrons 2000 from a specimen (not shown in FIG. 20) pass through deflector 2002, which may be configured as described further herein. After signal electrons 2000 pass through deflector 2002, they may pass through focusing lens mesh 2004 positioned between ground electrodes 2006. The focusing lens mesh and ground electrodes may be configured as described herein. After passing through the focusing lens mesh, the signal electrodes may be directed to first repelling mesh 100. First repelling mesh 100, second repelling mesh 106, and first attracting mesh 112 may form a triangular energy band cavity, which may be further configured as described herein. This embodiment of the system may also include electrode block 214, first detector 210, and second detector 212, which may be configured as described further herein.

Figure 21:
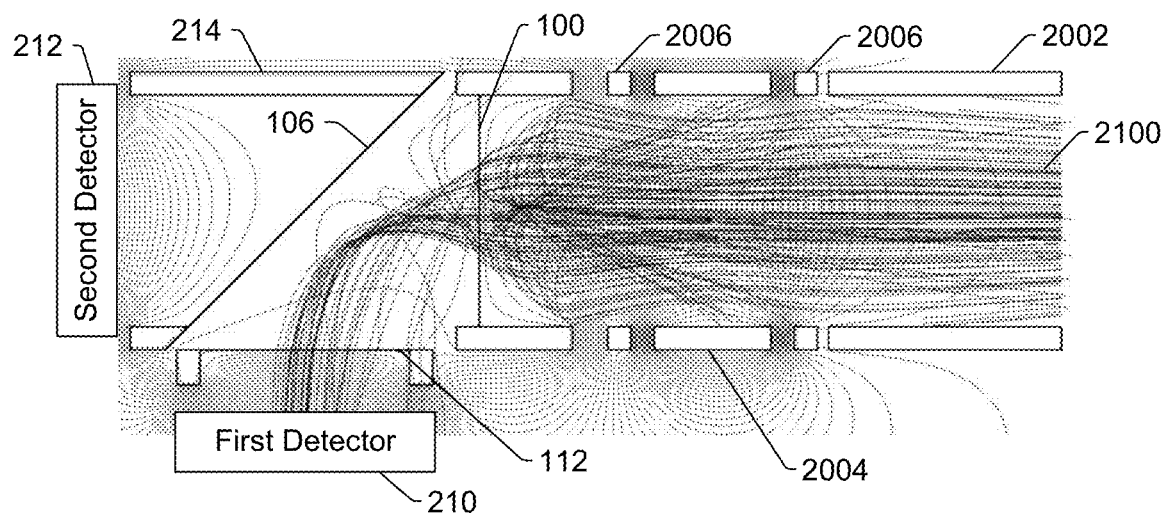
FIG. 21 is a schematic diagram illustrating a cross-sectional view of the embodiment of FIG. 20 with examples of simulations of the paths of charged particles with various energies through the system.

FIG. 21 shows simulation results of the paths of only the electrons that are collected by the first detector through the system embodiment of FIG. 20. In other words, FIG. 21 shows the paths of only electrons within a specific energy band entering into the detector assembly. As shown in FIG. 21, electrons 2100 with energies between E1 and E2 are collected on first detector 210 with a substantially high transmission rate. However, as further shown by FIG. 21, this structure can have band-pass filtering performance, but its transmission rate is much lower than other embodiments described herein because lots of "useful" electrons are repelled back by the first repelling mesh due to the unwanted lensing field between the first repelling mesh and the focusing lens mesh.

Figure 22:
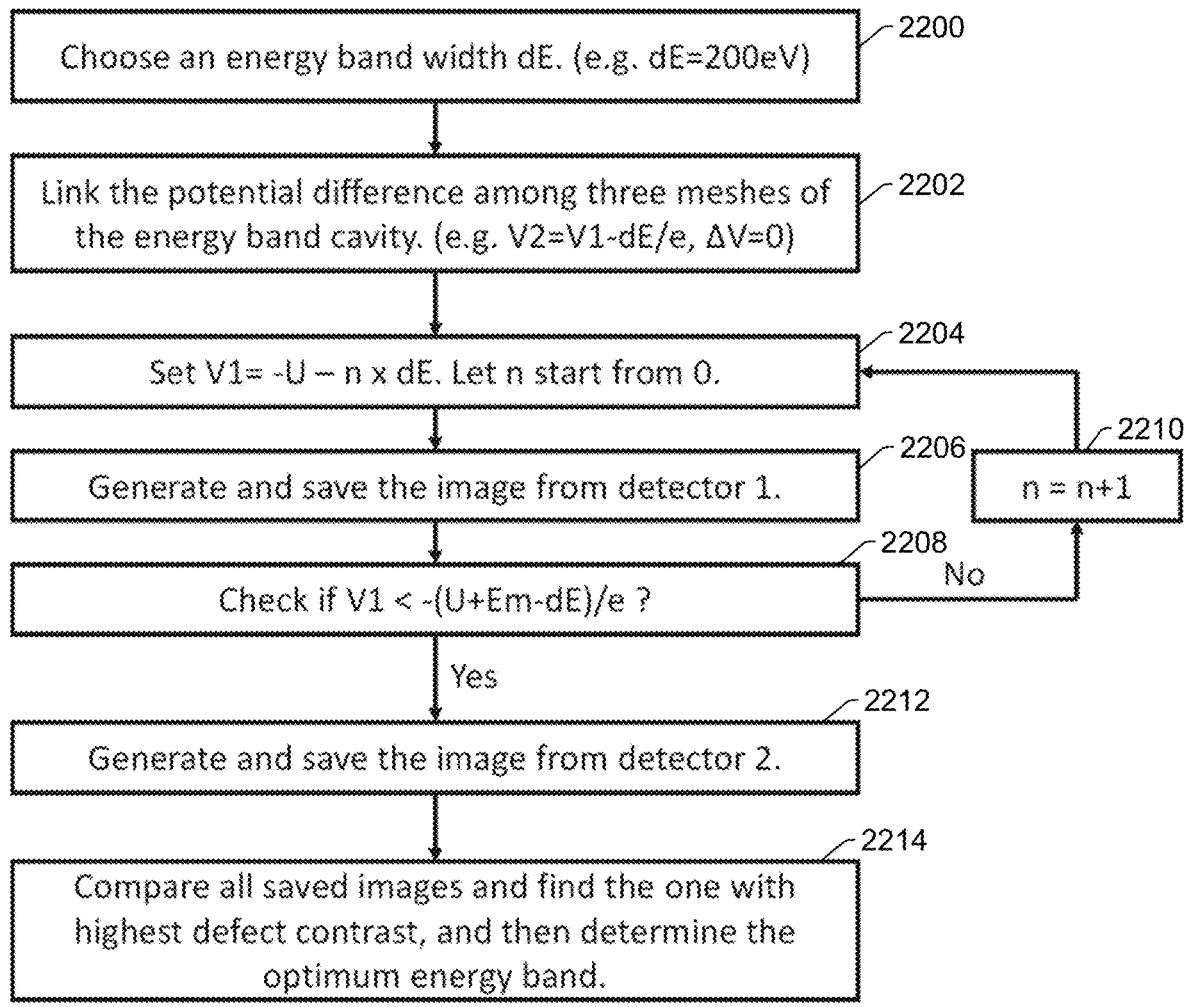
FIG. 22 is a flow chart illustrating one embodiment of steps that may be performed for dynamically searching for an optimum energy band for highest defect contrast.

In some embodiments, the system includes a computer subsystem configured to systematically alter potentials applied to the first repelling mesh, second repelling mesh, and first attracting mesh to thereby systematically alter the first and second predetermined energies, to compare the output generated by the first detector for at least two of the systematically altered potentials, and to select the potentials applied to the first repelling mesh, second repelling mesh, and first attracting mesh for a process performed on the specimen based on results of comparing the output. FIG. 22 shows one embodiment of a method for dynamically searching the optimum energy band for achieving the highest contrast of any specific defects. One advantage of the embodiments described herein is that they provide the ability to automatically search the optimum energy band for the highest defect contrast.

As shown in step 2200 of FIG. 22, the computer subsystem may choose an energy band width dE (e.g., dE=200 eV). The computer subsystem may then link the potential difference among three meshes of the energy band cavity (e.g., V2=V1−dE/e, ΔV=0), as shown in step 2202 of FIG. 22. The computer subsystem may set V1=−U−n×dE and let n start from 0, as shown in step 2204. The computer subsystem may generate and save the image from detector 1, as shown in step 2206. The computer subsystem may then check if V1<−(U+Em−dE)/e, as shown in step 2208. If V1 is not less than −(U+Em−dE)/e, the computer subsystem may set n=n+1, as shown in step 2210, and repeat steps 2204, 2206, and 2208. If V1 is less than −(U+Em−dE)/e, the computer subsystem may generate and save the image from detector 2, as shown in step 2212. As shown in step 2214, the computer subsystem may compare all saved images and find the one with the highest defect contrast and then determine the optimum energy band.

The detector assembly embodiments described herein can be implemented in a wide variety of tools including commercially available electron beam systems from KLA. Such electron beam systems also include, but are not limited to, single or multi-beam systems, imaging or non-imaging systems, analytic instruments such as spectrometers, etc. In addition, the detector assembly embodiments described herein may be particularly valuable for electron beam inspection and e-overlay tools because they can enhance the contrast of buried defects and features.

Figure 23:
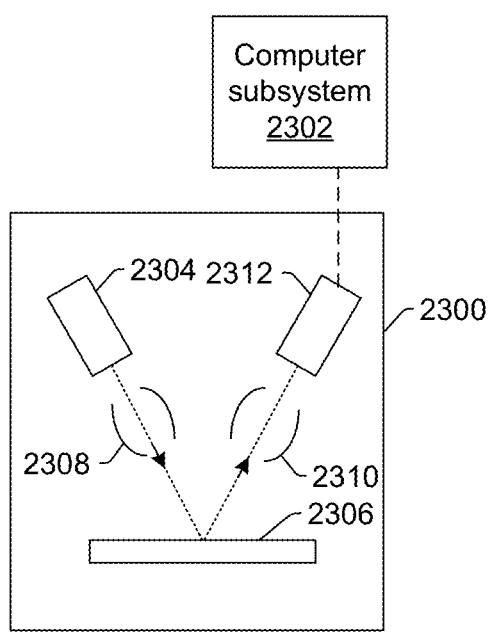
FIG. 23 is a schematic diagram illustrating a side view of one embodiment of a system in which the embodiments of the systems configured to detect charged particles from a specimen described herein may be used.

FIG. 23 illustrates one embodiment of a tool in which the detector assembly embodiments described herein may be used. In this tool, the energy directed to the specimen includes electrons, and the energy detected from the specimen includes electrons. As shown in FIG. 23, the tool includes electron column 2300 and computer subsystem 2302. Computer subsystem 2302 may be configured as described further herein.

As also shown in FIG. 23, the electron column includes electron beam source 2304 configured to generate electrons that are focused to specimen 2306 by one or more elements 2308. The electron beam source may include, for example, a cathode source or emitter tip, and one or more elements 2308 may include, for example, a gun lens, an anode, a beam limiting aperture, a gate valve, a beam current selection aperture, an objective lens, and a scanning subsystem, all of which may include any such suitable elements known in the art.

Electrons returned from the specimen (e.g., secondary electrons, etc.) may be focused by one or more elements 2310 to detector assembly 2312. One or more elements 2310 may include, for example, a scanning subsystem, which may be the same scanning subsystem included in element(s) 2308. Detector assembly 2312 may include any of the detector assembly embodiments described herein.

The electron column may include any other suitable elements known in the art. In addition, the electron column may be further configured as described in U.S. Pat. No. 7,141,791 issued Nov. 28, 2006 to Masnaghetti et al., U.S. Pat. No. 7,276,694 issued Oct. 2, 2007 to Bertsche, U.S. Pat. No. 7,714,287 issued May 11, 2010 to James et al., U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., U.S. Pat. No. 8,716,662 issued May 6, 2014 to MacDonald et al., and U.S. Pat. No. 9,000,395 issued Apr. 7, 2015 to Ren et al., which are incorporated by reference as if fully set forth herein.

Although the electron column is shown in FIG. 23 as being configured such that the electrons are directed to the specimen at an oblique angle of incidence and are scattered from the specimen at another oblique angle, the electron beam may be directed to and scattered from the specimen at any suitable angles. In addition, the electron beam tool may be configured to use multiple modes to generate output for the specimen (e.g., with different illumination angles, collection angles, etc.). The multiple modes of the electron beam tool may be different in any output generation parameters of the tool.

The detector(s) of the detector assembly may detect electrons returned from the surface of the specimen thereby forming electron beam images of (or other output for) the specimen. The electron beam images may include any suitable electron beam images. Computer subsystem 2302 may be coupled to the detector(s) (not shown in FIG. 23) included in the detector assembly in any suitable manner (e.g., via one or more transmission media, which may include "wired" and/or "wireless" transmission media) such that the computer subsystem can receive the output generated by the detector(s). Computer subsystem 2302 may be configured to perform a number of functions using the output of the detector(s).

In another embodiment, the system includes a computer subsystem configured to detect defects on the specimen based on the output generated by the first detector. For instance, the computer subsystem may be configured to detect events on the specimen using the output of the detector(s). Detecting the events on the specimen may be performed by applying some defect detection algorithm and/or method to the output generated by the detector(s), which may include any suitable algorithm and/or method known in the art. For example, the computer subsystem may compare the output of the detector(s) to a threshold. Any output having values above the threshold may be identified as an event (e.g., a potential defect) while any output having values below the threshold may not be identified as an event. Computer subsystem 2302 may be configured to perform any additional step(s) described herein.

The computer subsystem of the tool (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem (not shown), then the different computer subsystems may be coupled to each other such that images, data, information, instructions, etc. can be sent between the computer subsystems. Multiple computer subsystems may be coupled to each other with any suitable transmission media, which may include any suitable wired and/or wireless transmission media known in the art. Two or more of such computer subsystems may also be effectively coupled by a shared computer-readable storage medium (not shown).

It is noted that FIG. 23 is provided herein to generally illustrate a configuration of an electron beam tool in which the embodiments of the detector assemblies described herein may be used. The electron beam tool configuration described herein may be altered to optimize the performance of the tool as is normally performed when designing a commercial tool. In addition, the detector assemblies described herein may be implemented in an existing tool (e.g., by adding functionality described herein to an existing tool) such as the tools that are commercially available from KLA. For some such systems, the detector assemblies described herein may be provided as optional functionality of the system (e.g., in addition to other functionality of the system). Alternatively, the system described herein may be designed "from scratch" to provide a completely new system. The system shown in FIG. 23 may be further configured as described herein.

Although the tool is described above as being an electron beam tool, the tool may be an ion beam tool. Such a tool may be configured as shown in FIG. 23 except that the electron beam source may be replaced with any suitable ion beam source known in the art. In addition, the tool may include any other suitable ion beam imaging tool such as those included in commercially available focused ion beam (FIB) systems, helium ion microscopy (HIM) systems, and secondary ion mass spectroscopy (SIMS) systems.

As described above, the computer subsystem may use the output generated by the detector(s) to detect defects on the specimen. In this manner, the system described herein may be configured as an inspection system. In some embodiments, the system includes a computer subsystem configured to review defects detected on the specimen by a different system based on the output generated by the first detector. In a further embodiment, the system includes a computer subsystem configured to determine overlay information for the specimen based on the output generated by the first detector. In yet another embodiment, the system includes a computer subsystem configured to determine one or more characteristics of patterned features formed on the specimen based on the output generated by the first detector. For example, the system described herein may be configured as a metrology or defect review system. In particular, the embodiment of the system described herein and shown in FIG. 23 may be modified in one or more parameters to provide different imaging capability depending on the application for which it will be used. In one such example, the electron column shown in FIG. 23 may be configured to have a higher resolution if it is to be used for metrology rather than for inspection. In other words, the embodiments of the system shown in FIG. 23 describe some general and various configurations for a system that can be tailored in a number of manners that will be obvious to one skilled in the art to produce systems having different imaging capabilities that are more or less suitable for different applications.

The computer subsystem may be configured to review defects detected on the specimen in any suitable manner. For example, the computer subsystem may cause the electron column to collect images at locations of defects detected by another system. The computer subsystem may apply some defect redetection algorithm or method to the images to relocate the defects in the review images. The computer subsystem may then determine one or more characteristics of the redetected defects such as size, shape, contrast, texture, roughness, and patterns near or surrounding the redetected defect. The computer subsystem may use that information for the one or more characteristics to determine additional information about the redetected defects such as a classification, a severity measure, and the like.

The computer subsystem may be configured to determine one or more characteristics of patterned features formed on the specimen and overlay information in any suitable manner known in the art. For example, the computer subsystem may cause the electron column to generate images at locations where patterned features are to be measured and/or where overlay information is to be generated. The computer subsystem may then apply one or more image processing algorithms or methods to the images to determine one or more characteristics of the patterned features such as one or more dimensions, e.g., line width, texture, roughness, shape, etc. and/or overlay information such as displacement of one pattern on one layer of the specimen with respect to another pattern on another layer of the specimen.

In some embodiments, the system includes a second detector configured to generate output responsive to the charged particles that pass through the second repelling mesh and a computer subsystem configured to determine information for the specimen from the output generated by the first detector and the output generated by the second detector. For example, the embodiments described herein may include multiple detectors that generate output for the specimen simultaneously. Therefore, for any one location on the specimen, multiple outputs may be generated by multiple detectors simultaneously and available for use by the embodiments described herein. The computer subsystem may then use the multiple outputs generated for the same location on the specimen in a variety of ways including those described above to determine any of the information described herein for a specimen.

The computer subsystem is also not limited in using the outputs from only the first and second detectors for determining the information but may use the outputs for any of the detectors that are included in the system for determining the information. The computer subsystem may select different sets of outputs for determining different information. For example, in some instances, the outputs generated by the first and to second detectors may be particularly useful for determining first information for the specimen, and the outputs generated by the first and third detectors may be particularly useful for determining second information for the specimen.

Because the embodiments described herein are flexible and can be easily configured based on the types and/or energies of charged particles that each detector detects (e.g., by selecting the optimum energy band(s) as described above), based on information about which types of charged particles are sensitive to which specimen information, the computer subsystem may select various parameters of the system to determine the specimen information with the most sensitivity and/or the highest accuracy even when the specimen information is being determined using output generated by multiple detectors.

In one such embodiment, the computer subsystem is configured to determine the information for the specimen by generating an image for a defect on the specimen from the output generated by the first detector and the output generated by the second detector. For example, the outputs from different detectors may not just be used separately to determine information for the specimen but may be used to generate a new output for the specimen that is then used to determine the information. In one such example, a comparison or algebraic operation (e.g., addition, subtraction, averaging, etc.) of two images from two detectors may enhance the contrast of defects in the resulting image. Therefore, two images may be used to generate new, third image that has better contrast for the defects, and the computer subsystem may use the third image to detect the defects or determine information for the defects such as one or more defect characteristics. Such images may also be useful for determining other specimen information described herein such as patterned feature characteristic(s).

The computer subsystem may be configured for storing results of any step(s) performed by the system in any suitable computer-readable storage medium. The results may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. For example, if the system is configured as an inspection tool, the system may perform an inspection process on a specimen and may produce results for any defects detected on the specimen such as information, e.g., location, etc., of the bounding boxes of the detected defects, detection scores, information about defect classifications such as class labels or IDs, etc., or any such suitable information known in the art. The results for the defects may be generated by the computer subsystem in any suitable manner. The results for the defects may have any suitable form or format such as a standard file type. The computer subsystem may generate the results and store the results such that the results can be used by the computer subsystem and/or another system or method to perform one or more functions for the specimen or another specimen of the same type.

Results and information generated by the system embodiments described herein may be used in a variety of manners by the embodiments described herein and/or other systems and methods. Such functions include, but are not limited to, altering a process such as a fabrication process or step that was or will be performed on the specimen or another specimen in a feedback or feedforward manner. For example, the computer subsystem described herein may be configured to determine one or more changes to a process that was performed on a specimen inspected as described herein and/or a process that will be performed on the specimen based on the detected defect(s). The changes to the process may include any suitable changes to one or more parameters of the process. The computer subsystem described herein preferably determines those changes such that the defects can be reduced or prevented on other specimens on which the revised process is performed, the defects can be corrected or eliminated on the specimen in another process performed on the specimen, the defects can be compensated for in another process performed on the specimen, etc. The computer subsystem described herein may determine such changes in any suitable manner known in the art. Such changes may also be determined using results of other processes described herein.

Those changes can then be sent to a semiconductor fabrication system (not shown) or a storage medium (not shown) accessible to the computer subsystem and the semiconductor fabrication system. The semiconductor fabrication system may or may not be part of the system embodiments described herein. For example, the computer subsystem and/or tool described herein may be coupled to the semiconductor fabrication system, e.g., via one or more common elements such as a housing, a power supply, a specimen handling device or mechanism, etc. The semiconductor fabrication system may include any semiconductor fabrication system known in the art such as a lithography tool, an etch tool, a chemical-mechanical polishing (CMP) tool, a deposition tool, and the like.

Each of the embodiments of the system may be further configured according to any other embodiment(s) described herein.

Figure 24:
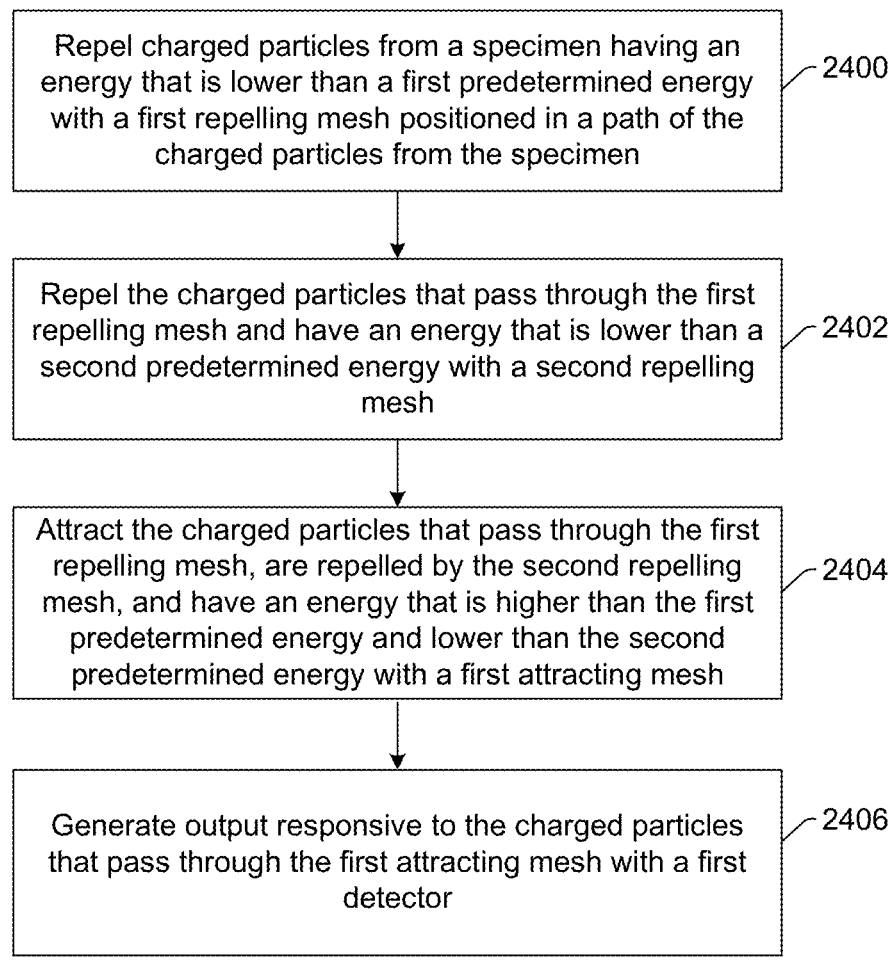
FIG. 24 is a flow chart illustrating one embodiment of steps included in a method for detecting charged particles from a specimen.

Another embodiment relates to a computer-implemented method for detecting charged particles from a specimen. The method includes repelling charged particles from a specimen having an energy that is lower than a first predetermined energy with a first repelling mesh positioned in a path of the charged particles from the specimen, as shown in step 2400 of FIG. 24. The method also includes repelling the charged particles that pass through the first repelling mesh and have an energy that is lower than a second predetermined energy with a second repelling mesh, as shown in step 2402 of FIG. 24. In addition, the method includes attracting the charged particles that pass through the first repelling mesh, are repelled by the second repelling mesh, and have an energy that is higher than the first predetermined energy and lower than the second predetermined energy with a first attracting mesh, as shown in step 2404 of FIG. 24. The method further includes generating output responsive to the charged particles that pass through the first attracting mesh with a first detector, as shown in step 2406 of FIG. 24. Each of the steps of the method may be performed as described further herein. The method may also include any other step(s) that can be performed by the system(s) described herein. The steps of the method may be performed by the systems described herein, which may be configured according to any of the embodiments described herein.

Figure 25:
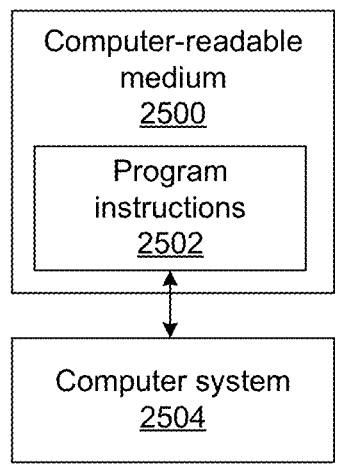
FIG. 25 is a block diagram illustrating one embodiment of a non-transitory computer-readable medium storing program instructions executable on a computer system for performing one or more of the computer-implemented methods described herein.

An additional embodiment relates to a non-transitory computer-readable medium storing program instructions executable on a computer system for performing a computer-implemented method for detecting charged particles from a specimen. One such embodiment is shown in FIG. 25. In particular, as shown in FIG. 25, non-transitory computer-readable medium 2500 includes program instructions 2502 executable on computer system 2504. The computer-implemented method may include any step(s) of any method(s) described herein.

Program instructions 2502 implementing methods such as those described herein may be stored on computer-readable medium 2500. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system 2504 may be configured according to any of the embodiments described herein.

Further modifications and alternative embodiments of various aspects of the invention will be apparent to those skilled in the art in view of this description. For example, methods and systems for detecting charged particles from a specimen are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to detect charged particles from a specimen, comprising:
    a first repelling mesh positioned in a path of charged particles from a specimen and configured to repel the charged particles having an energy that is lower than a first predetermined energy;
    a second repelling mesh configured to repel the charged particles that pass through the first repelling mesh and have an energy that is lower than a second predetermined energy;
    a first attracting mesh configured to attract the charged particles that pass through the first repelling mesh, are repelled by the second repelling mesh, and have an energy that is higher than the first predetermined energy and lower than the second predetermined energy;
    a first detector configured to generate output responsive to the charged particles that pass through the first attracting mesh; and
    a computer subsystem configured to systematically alter potentials applied to the first repelling mesh, second repelling mesh, and first attracting mesh to thereby systematically alter the first and second predetermined energies, to compare the output generated by the first detector for at least two of the systematically altered potentials, and to select the potentials applied to the first repelling mesh, second repelling mesh, and first attracting mesh for a process performed on the specimen based on results of comparing the output.

2. The system of claim 1, wherein the first repelling mesh, the second repelling mesh, and the first attracting mesh form a triangular energy band cavity.

3. The system of claim 1, wherein the first repelling mesh, the second repelling mesh, and the first attracting mesh form at least a portion of a square energy band cavity.

4. The system of claim 1, wherein the first repelling mesh, the second repelling mesh, the first attracting mesh, and an electrode block form a square energy band cavity, and wherein the second repelling mesh and the electrode block have the same potential.

5. The system of claim 1, further comprising a second detector configured to detect the charged particles that pass through the second repelling mesh.

6. The system of claim 1, wherein the first detector is grounded.

7. The system of claim 1, wherein the first detector is biased with a positive voltage.

8. The system of claim 1, wherein the first detector is biased with a voltage that is tunable.

9. The system of claim 1, wherein the first detector is biased with a voltage, and wherein the first attracting mesh shields the space between the first repelling mesh, the second repelling mesh, and the first attracting mesh from an electrical field from the detector.

10. The system of claim 1, further comprising a deflector configured to alter a position of the path of the charged particles from the specimen before the charged particles reach the first repelling mesh.

11. The system of claim 10, further comprising a focusing lens configured to focus the charged particles from the deflector and to collimate the charged particles having an energy that is higher than the first predetermined energy and lower than the second predetermined energy to pass through the first repelling mesh.

12. The system of claim 11, further comprising differential potential electrodes surrounding the path of the charged particles between the focusing lens and the first repelling mesh.

13. The system of claim 12, wherein the differential potential electrodes are configured for reducing formation of a lensing field between the focusing lens and the first repelling mesh.

14. The system of claim 1, wherein an energy band between the first and second predetermined energies is equal to an energy band of 0 eV to 50 eV.

15. The system of claim 1, wherein an energy band between the first and second predetermined energies is equal to an energy band of Em-100 eV, and wherein Em is a maximum emitting charged particle energy from the specimen.

16. The system of claim 1, wherein an energy band between the first and second predetermined energies is equal to an energy band of 50 eV-Em, and wherein Em is a maximum emitting charged particle energy from the specimen.

17. The system of claim 1, wherein the first and second predetermined energies are selected based on a type of defects to be detected on the specimen based on the output generated by the first detector.

18. The system of claim 1, wherein the first and second predetermined energies are selected based on a type of the charged particles to be detected from the specimen.

19. The system of claim 1, wherein an energy band between the first and second predetermined energies corresponds to energies of only secondary charged particles from the specimen, and wherein the computer subsystem is further configured to detect surface or voltage contrast defects on the specimen based on the output generated by the first detector.

20. The system of claim 1, wherein an energy band between the first and second predetermined energies corresponds to energies of only elastic backscattering charged particles from the specimen, and wherein the computer subsystem is further configured to detect high aspect ratio or materials contrast defects on the specimen based on the output generated by the first detector.

21. The system of claim 1, wherein an energy band between the first and second predetermined energies corresponds to energies of only inelastic backscattering charged particles from the specimen, and wherein the computer subsystem is further configured to detect buried defects on the specimen based on the output generated by the first detector.

22. The system of claim 21, further comprising a third repelling mesh configured to repel the charged particles that pass through the second repelling mesh and have an energy that is lower than a third predetermined energy; a second attracting mesh configured to attract the charged particles that pass through the second repelling mesh, are repelled by the third repelling mesh, and have an energy that is higher than the second predetermined energy and lower than the third predetermined energy; and a second detector configured to generate output responsive to the charged particles that pass through the second attracting mesh.

23. The system of claim 22, further comprising a fourth repelling mesh configured to repel the charged particles that pass through the third repelling mesh and have an energy that is lower than a fourth predetermined energy; a third attracting mesh configured to attract the charged particles that pass through the third repelling mesh, are repelled by the fourth repelling mesh, and have an energy that is higher than the third predetermined energy and lower than the fourth predetermined energy; and a third detector configured to generate output responsive to the charged particles that pass through the third attracting mesh.

24. The system of claim 23, further comprising a fifth repelling mesh configured to repel the charged particles that pass through the fourth repelling mesh and have an energy that is lower than a fifth predetermined energy; a fourth attracting mesh configured to attract the charged particles that pass through the fourth repelling mesh, are repelled by the fifth repelling mesh, and have an energy that is higher than the fourth predetermined energy and lower than the fifth predetermined energy; and a fourth detector configured to generate output responsive to the charged particles that pass through the fourth attracting mesh.

25. The system of claim 24, further comprising a fifth detector configured to generate output responsive to the charged particles that pass through the fifth repelling mesh.

26. The system of claim 1, wherein the computer subsystem is further configured to detect defects on the specimen based on the output generated by the first detector.

27. The system of claim 1, wherein the computer subsystem is further configured to review defects detected on the specimen by a different system based on the output generated by the first detector.

28. The system of claim 1, wherein the computer subsystem is further configured to determine overlay information for the specimen based on the output generated by the first detector.

29. The system of claim 1, wherein the computer subsystem is further configured to determine one or more characteristics of patterned features formed on the specimen based on the output generated by the first detector.

30. The system of claim 1, further comprising a second detector configured to generate output responsive to the charged particles that pass through the second repelling mesh, and wherein the computer subsystem is further configured to determine information for the specimen from the output generated by the first detector and the output generated by the second detector.

31. The system of claim 30, wherein the computer subsystem is further configured to determine the information for the specimen by generating an image for a defect on the specimen from the output generated by the first detector and the output generated by the second detector.

32. The system of claim 1, wherein the charged particles are electrons.

33. The system of claim 1, wherein the charged particles are helium ions.

34. A system configured to detect charged particles from a specimen, comprising:
- a first repelling mesh positioned in a path of charged particles from a specimen and configured to repel the charged particles having an energy that is lower than a first predetermined energy;
- a second repelling mesh configured to repel the charged particles that pass through the first repelling mesh and have an energy that is lower than a second predetermined energy;
- a first attracting mesh configured to attract the charged particles that pass through the first repelling mesh, are repelled by the second repelling mesh, and have an energy that is higher than the first predetermined energy and lower than the second predetermined energy, wherein an energy band between the first and second predetermined energies corresponds to energies of only elastic backscattering charged particles from the specimen;
- a first detector configured to generate output responsive to the charged particles that pass through the first attracting mesh; and
- a computer subsystem configured to detect high aspect ratio or materials contrast defects on the specimen based on the output generated by the first detector.

35. A system configured to detect charged particles from a specimen, comprising:
- a first repelling mesh positioned in a path of charged particles from a specimen and configured to repel the charged particles having an energy that is lower than a first predetermined energy;
- a second repelling mesh configured to repel the charged particles that pass through the first repelling mesh and have an energy that is lower than a second predetermined energy;
- a first attracting mesh configured to attract the charged particles that pass through the first repelling mesh, are repelled by the second repelling mesh, and have an energy that is higher than the first predetermined energy and lower than the second predetermined energy, wherein an energy band between the first and second predetermined energies corresponds to energies of only inelastic backscattering charged particles from the specimen;
- a first detector configured to generate output responsive to the charged particles that pass through the first attracting mesh; and
- a computer subsystem configured to detect buried defects on the specimen based on the output generated by the first detector.

* * * * *